United States Patent
Endo et al.

(10) Patent No.: US 8,136,219 B2
(45) Date of Patent: Mar. 20, 2012

(54) ELECTRONIC COMPONENT MOUNTER AND MOUNTING METHOD

(75) Inventors: Tadashi Endo, Fukuoka (JP); Akira Noudo, Fukuoka (JP); Takeyuki Kawase, Saga (JP); Osamu Okuda, Fukuoka (JP); Hiroshi Ogata, Fukuoka (JP)

(73) Assignee: Panasonic Corporation, Osaka (JP)

( * ) Notice: Subject to any disclaimer, the term of this patent is extended or adjusted under 35 U.S.C. 154(b) by 1049 days.

(21) Appl. No.: 11/915,982

(22) PCT Filed: Jul. 31, 2006

(86) PCT No.: PCT/JP2006/315543
§ 371 (c)(1),
(2), (4) Date: Nov. 29, 2007

(87) PCT Pub. No.: WO2007/015561
PCT Pub. Date: Feb. 8, 2007

(65) Prior Publication Data
US 2009/0300908 A1  Dec. 10, 2009

(30) Foreign Application Priority Data

Aug. 2, 2005  (JP) ................. 2005-223681
Aug. 3, 2005  (JP) ................. 2005-224892
Aug. 18, 2005  (JP) ................. 2005-237334

(51) Int. Cl.
*H05K 13/04* (2006.01)
(52) U.S. Cl. ............... 29/593; 29/833; 29/743; 29/739
(58) Field of Classification Search ........... 29/740–741, 29/743, 593, 833, 739
See application file for complete search history.

(56) References Cited

U.S. PATENT DOCUMENTS

| | | | | |
|---|---|---|---|---|
| 4,794,689 A | * | 1/1989 | Seno et al. | 29/740 |
| 4,951,388 A | * | 8/1990 | Eguchi et al. | 29/832 |
| 4,979,286 A | * | 12/1990 | Nakayama et al. | 29/740 |
| 5,491,888 A | * | 2/1996 | Sakurai et al. | 29/832 |
| 5,560,100 A | * | 10/1996 | Englert | 29/833 |

(Continued)

FOREIGN PATENT DOCUMENTS

JP  7-38294  2/1995

(Continued)

OTHER PUBLICATIONS

International Search Report issued Oct. 19, 2006 in the International (PCT) Application of which the present application is the U.S. National Stage.

(Continued)

*Primary Examiner* — Derris Banks
*Assistant Examiner* — Kaying Kue
(74) *Attorney, Agent, or Firm* — Wenderoth, Lind & Ponack, L.L.P.

(57) ABSTRACT

A method by which the height of an electronic component sucked and held by a nozzle can be detected with high accuracy and high efficiency is a component height measurement method applied to a mounter (100) equipped with a transfer head (8) having a component-sucking-and-holding nozzle (21), for transferring a component P and mounting the component P onto a board (3), and includes: lowering the component P to within the high-accuracy range of a first line sensor (13) for measuring the height of the component P; and measuring the height of the component P using the first line sensor (13).

7 Claims, 21 Drawing Sheets

U.S. PATENT DOCUMENTS

| | | | |
|---|---|---|---|
| 5,570,993 A * | 11/1996 | Onodera et al. | 414/783 |
| 5,749,142 A * | 5/1998 | Hanamura | 29/833 |
| 5,864,944 A * | 2/1999 | Kashiwagi et al. | 29/833 |
| 6,000,123 A * | 12/1999 | Munezane et al. | 29/740 |
| 6,195,165 B1 * | 2/2001 | Sayegh | 356/613 |
| 6,370,764 B1 * | 4/2002 | Kinoshita et al. | 29/740 |
| 6,608,320 B1 * | 8/2003 | Skunes et al. | 250/559.19 |
| 6,662,437 B2 * | 12/2003 | Kawashima | 29/740 |
| 6,748,649 B2 * | 6/2004 | Okuda et al. | 29/740 |
| 6,948,232 B1 * | 9/2005 | Yazawa et al. | 29/740 |
| 7,822,593 B2 * | 10/2010 | Okuda | 703/20 |
| 2002/0092157 A1 * | 7/2002 | Yoshida et al. | 29/740 |
| 2003/0014862 A1 * | 1/2003 | Suhara et al. | 29/832 |
| 2003/0093896 A1 * | 5/2003 | Usui et al. | 29/743 |
| 2003/0110610 A1 * | 6/2003 | Duquette et al. | 29/407.09 |
| 2005/0102826 A1 * | 5/2005 | Asai et al. | 29/743 |
| 2006/0053624 A1 * | 3/2006 | Maeda et al. | 29/832 |
| 2006/0185162 A1 * | 8/2006 | Aoki et al. | 29/832 |

FOREIGN PATENT DOCUMENTS

| | | |
|---|---|---|
| JP | 11-154797 | 6/1999 |
| JP | 2002-111288 | 4/2002 |
| JP | 2004-342653 | 12/2004 |

OTHER PUBLICATIONS

Partial English translation of JP 2002-111288, which was cited in the IDS filed Nov. 29, 2007.

* cited by examiner

ELECTRONIC COMPONENT MOUNTER AND MOUNTING METHOD

TECHNICAL FIELD

The present invention relates to a method for measuring the height (thickness) of a component which is picked up by suction with a nozzle of a mounter and mounted onto a member such as a board and the like.

BACKGROUND ART

The height of an electronic component to be mounted is one of the important parameters for a mounter. To be more specific, if the actual height of an electronic component held by a transfer head for mounting it is different from a value assigned to the electronic component and stored for controlling the mounter, various types of problems occur when mounting the electronic component onto a board. For example, in the case where the actual height of an electronic component is less than the stored data, the electronic component is released before it reaches the board, and thus it may not be mounted in the right position on the board. Conversely, if the actual height of an electronic component is greater than the stored data, the electronic component is pressed against the board too strongly that the board, the electronic component or the nozzle may be damaged.

Conventionally, in order to enter height data of an electronic component into a mounter, the height data of the electronic component is obtained from the electronic component manufacturer and entered manually, or the electronic component is taken from a tape or the like for holding electronic components and measured using a slide caliper and the like, and the measured value is entered manually.

However, an electronic component may vary in its height depending on manufacturers or manufacturing lots even if its performance is unchanged. For example, when currently used components run out of stock under a situation where the lead time, from receipt of order of board production until shipping of the boards, is reduced, there is no choice but to use substitute components from another manufacturer. In such a case, the data of the substitute components has to be entered manually even if the performance of the components is unchanged. Such data entry is not only very troublesome but also causes measurement error or human error in the case where the height of a substitute component is measured and the data of the component is entered manually, and thus causes a discrepancy between the actual height of the component and the entered data.

So, in order to avoid measurement error and human error and ensure a precise match between the actual height of an electronic component and the data stored in a mounter, a patent application for a mounter as shown in FIG. 1 including a detector for detecting the size of a component so as to obtain and store the size of the component automatically has been filed (see, for example, Japanese Laid-Open Patent Application No. 07-38294).

In recent years, a so-called multifunction mounter which mounts a variety of electronic components ranging from tiny components to larger ones on its own has been widely used.

If a detector for detecting the size, in particular, the height of a component, is applied to such a multifunction mounter, the following problems occur. If a detector is attached to a transfer head of a mounter, it becomes possible to measure the height of a component during a period from when the transfer head picks up the component by suction until it moves above the board, and therefore the measurement of the height gives rise to no loss in takt time. On the other hand, a large-sized detector is needed to detect the height of a larger component. If such a detector is attached to the transfer head of the mounter, the size and weight of the detector burden the transfer head which moves at a high speed to mount components, and thus the positioning accuracy of the transfer head cannot be maintained.

Furthermore, since a large-sized detector has generally a low resolution, if this detector measures the height of a tiny component, the measurement error for the height is too large to mount the component without any problem. A large-sized detector with a high resolution unnecessarily leads to rise in cost.

SUMMARY OF INVENTION

So, the present invention has been conceived in view of the above problems, and it is an object of the present invention to provide a method for accurately measuring the heights of a variety of components ranging from tiny components to larger ones, using a sensor with a small measurement range.

In order to achieve the above object, the component height measurement method according to the present invention is a component height measurement method applied to a mounter equipped with a transfer head having a component-sucking-and-holding nozzle, for transferring a component and mounting the component onto a board, and this method includes: lowering the component to within a high-accuracy range of a sensor for measuring a height of the component; and measuring the height of the component using the sensor.

Accordingly, since the height of the component is measured after the component is lowered to within the high-accuracy range of the sensor, the height can be measured accurately.

This method further includes tentatively lowering the component sucked and held by the nozzle, and tentatively measuring the height of the component using an amount of lowering of the nozzle and a signal outputted from the sensor. In the lowering of the component, it is preferable to lower the component to within the high-accuracy range of the sensor, based on the height of the component measured in the tentative measuring.

Accordingly, since the height of the component is measured based on the amount of lowering of the nozzle and the signal outputted from the sensor, it is possible to measure the heights of various components ranging from tiny components to larger ones, even if a sensor is relatively small. In addition, even using a sensor having variable accuracy from one position to another, it is possible to ensure high measurement accuracy by measuring the component twice.

It is further preferable that this method includes lowering the nozzle which does not hold a component, and obtaining information regarding a vertical position of a lower end of the nozzle.

Accordingly, for a mounter in which a nozzle needs to be replaced, it becomes possible to avoid having an influence of dimensional accuracy or attachment accuracy of the nozzle on the measured value of the component height as much as possible.

It is preferable that, in the measuring of the component height, in the case where the measured height is less than a predetermined value, the height of the component is measured definitively while keeping the vertical position of the lower end of the nozzle at a predetermined position, while in the case where the measured height is equal to or greater than a predetermined value, the height of the component is measured definitively while keeping the vertical position of the lower end of the nozzle at a predetermined position.

Accordingly, when the height of a relatively thin component is measured, the repetitive error of the nozzle, rather than the lowering error thereof, has a greater influence on the measured value of its height. On the contrary, as for a relatively thick component, the lowering error of the nozzle has a greater influence on the measured value of its height. When the repetitive error is smaller than the lowering error, it is possible to lower the probability of occurrence of significant errors in the component height.

Note that the lowering error is an error between a value set for lowering a nozzle and an amount of actual lowering of the nozzle. The repetitive error is a variation error between values of actual lowering of a nozzle when the lowering of a set value is repeated several times.

In addition, one of the tentative measuring and the definitive measuring may be carried out while moving the sensor and the component relative to each other on a horizontal plane, after the nozzle is maintained in a stationary state.

Accordingly, the sensor can be moved out of the way to let the components be mounted. It is also possible to measure a number of components all at once.

Furthermore, a program for causing a computer to execute the above steps, a height measurement apparatus including the above steps as units, or a mounter including this height measurement apparatus can also achieve the same object as mentioned above and produce the same effects as mentioned above.

According to the present invention, it is possible to measure the heights of a variety of components ranging from tiny components to larger ones, using a high-accuracy portion of a small sensor, and therefore it is possible to detect the heights of electronic components with a high degree of accuracy.

As further information about technical background to this application, the disclosure of the following Japanese patent applications including specifications, drawings and claims are incorporated herein by reference in their entirety:
Japanese Patent Application No. 2005-223681 filed on Aug. 2, 2005;
Japanese Patent Application No. 2005-224892 filed on Aug. 3, 2005; and
Japanese Patent Application No. 2005-237334 filed on Aug. 18, 2005.

BRIEF DESCRIPTION OF DRAWINGS

These and other objects, advantages and features of the invention will become apparent from the following description thereof taken in conjunction with the accompanying drawings that illustrate a specific embodiment of the invention. In the Drawings.

DETAILED DESCRIPTION OF THE INVENTION

First Embodiment

Figure 1:
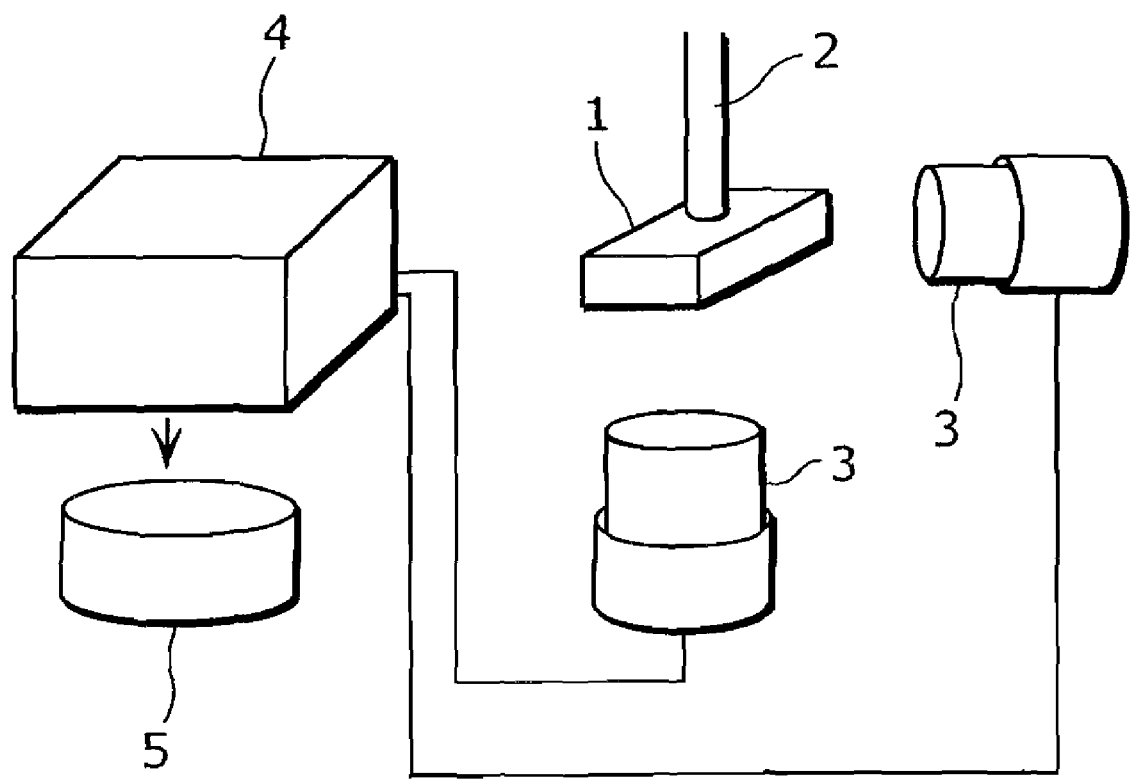
FIG. 1 is a conceptual diagram showing a conventional size detector.
Figure 2:
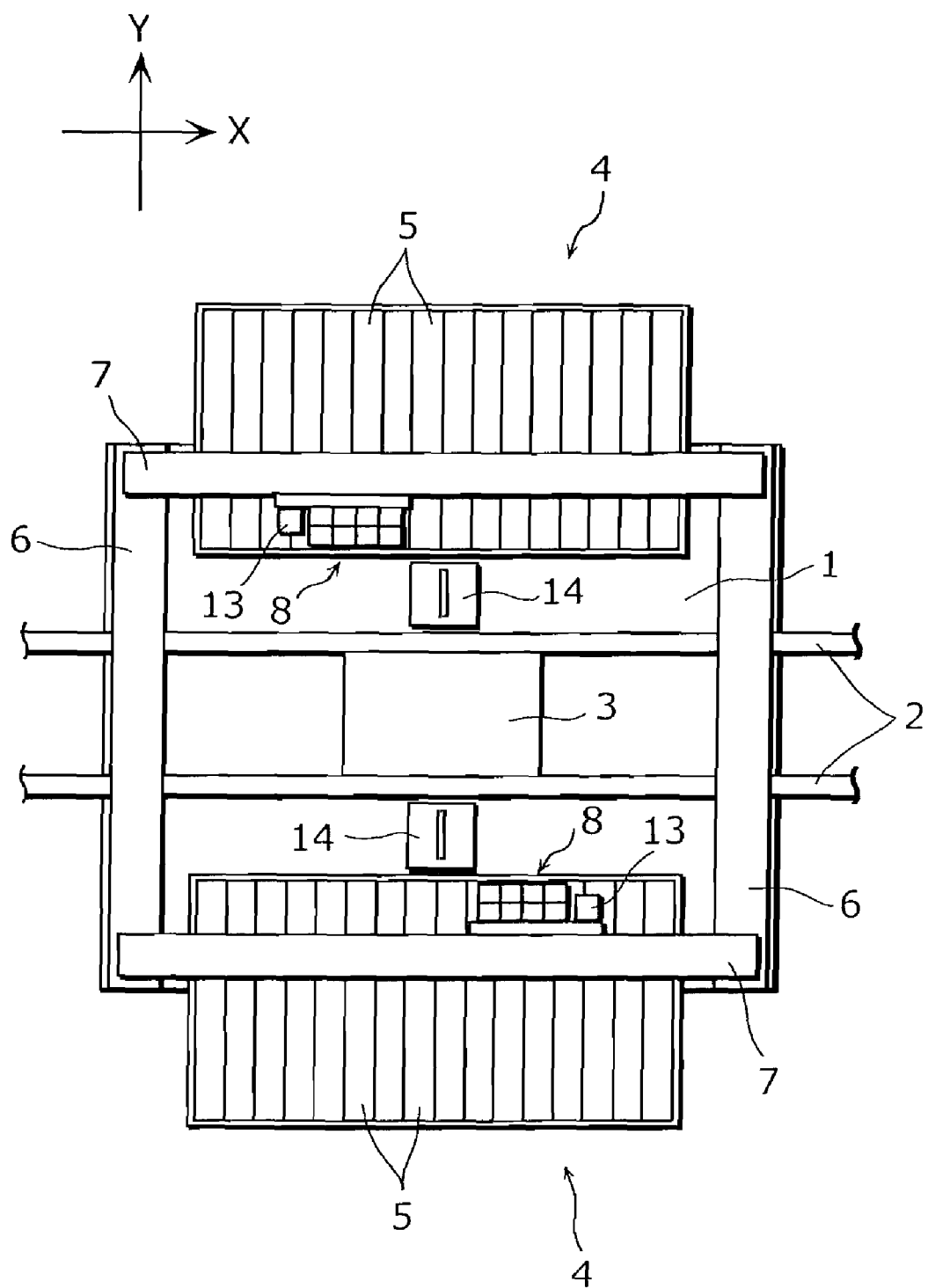
FIG. 2 is a plan view of an electronic component mounter in one of the embodiments of the present invention.
Figure 3A:
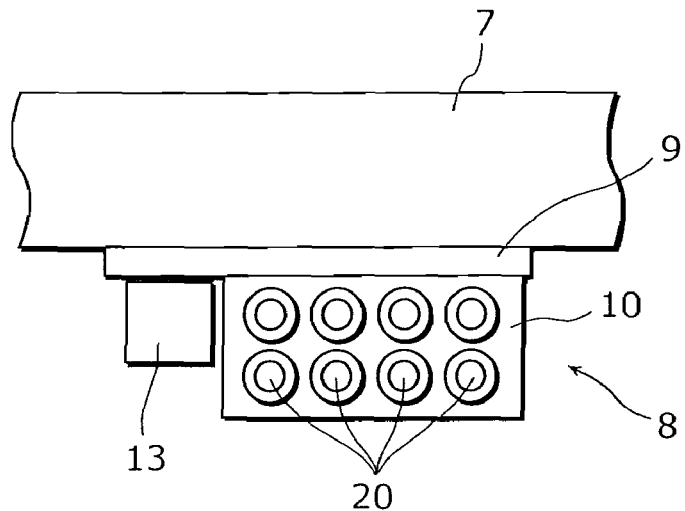
FIG. 3A is a front view of a transfer head of the electronic component mounter in one of the embodiments of the present invention.
Figure 3B:
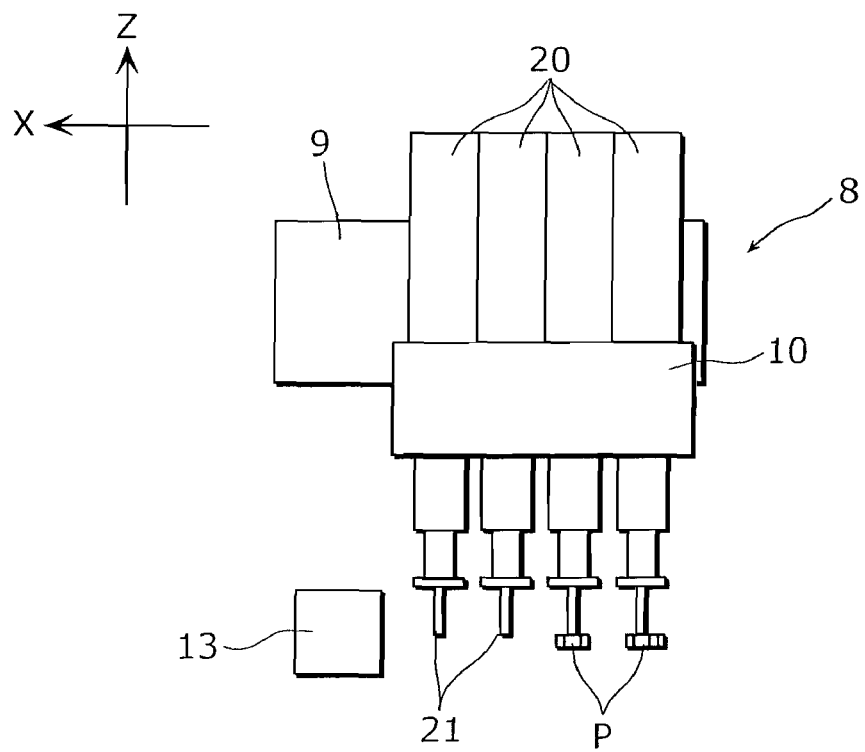
FIG. 3B is a side view of the transfer head of the electronic component mounter in one of the embodiments of the present invention.
Figure 3B:
Figure 4:
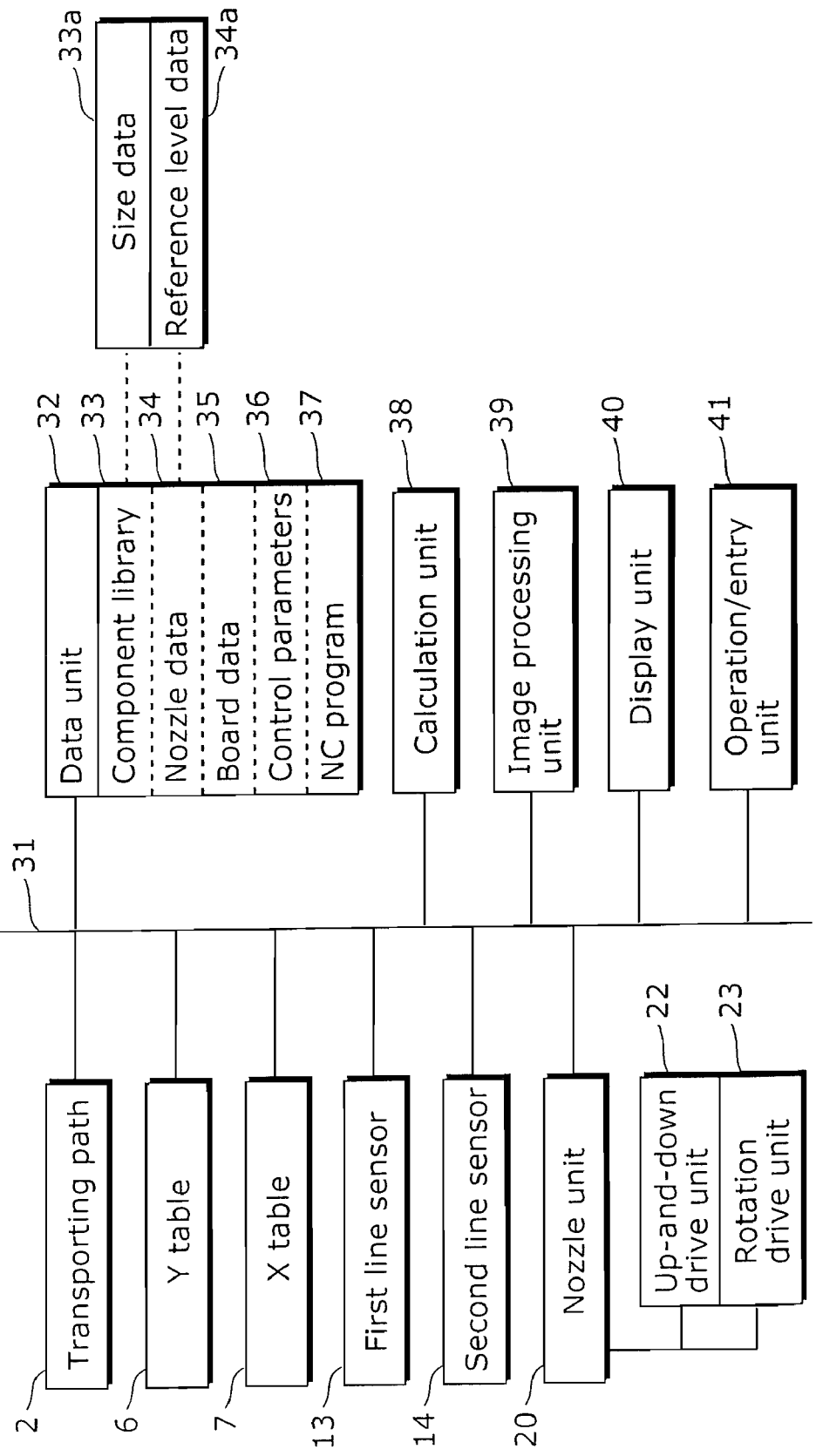
FIG. 4 is a configuration diagram of the control system of the electronic component mounter in one of the embodiments of the present invention.
Figure 5:
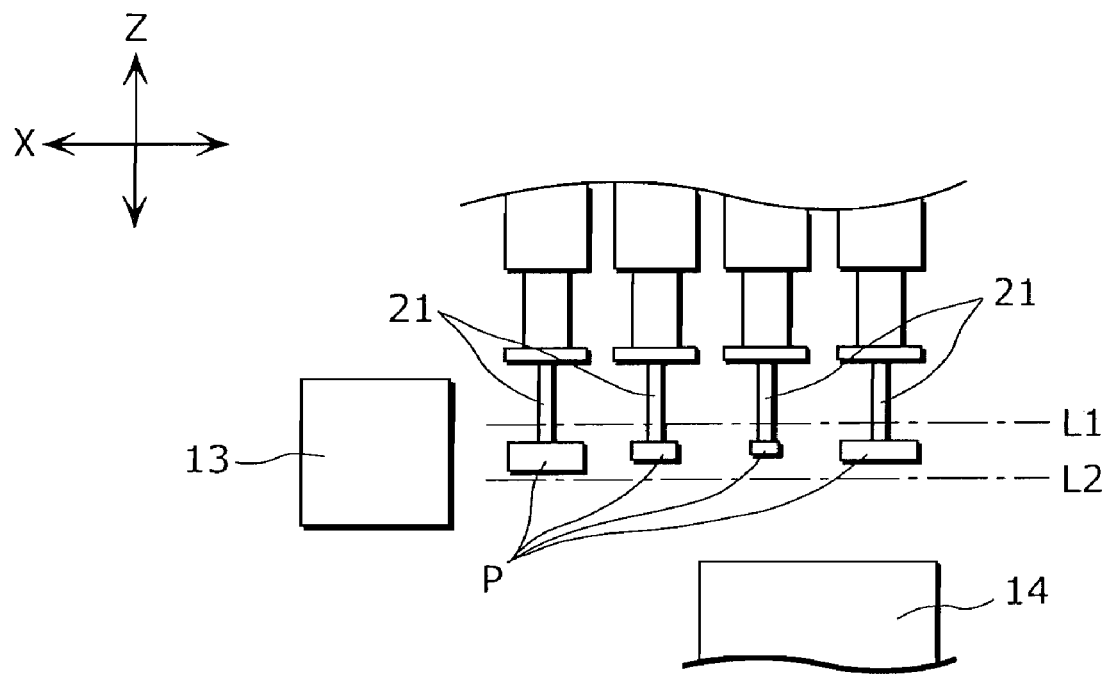
FIG. 5 is a diagram for explaining a method for detecting electronic component in one of the embodiments of the present invention.
Figure 6:
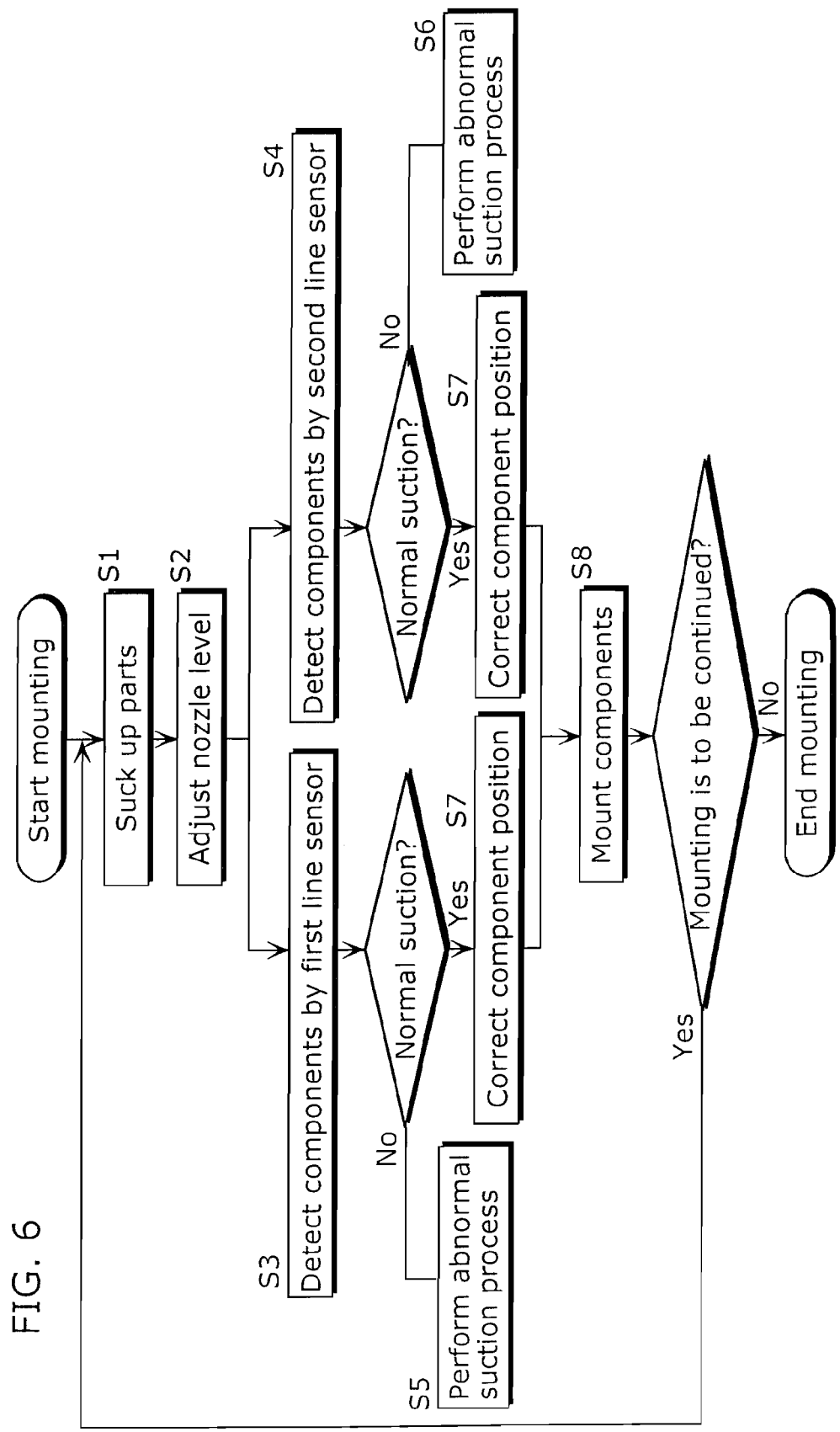
FIG. 6 is a flowchart of an operation sequence of the electronic component mounter in one of the embodiments of the present invention.

Next, an embodiment of the present invention is described with reference to drawings. FIG. 2 is a plan view of an electronic component mounter in one of the embodiments of the present invention; FIG. 3A is a front view of a transfer head of the electronic component mounter in one of the embodiments of the present invention; FIG. 3B is a side view of the transfer head of the electronic component mounter in one of the embodiments of the present invention; FIG. 4 is a configuration diagram of the control system of the electronic component mounter in one of the embodiments of the present invention; FIG. 5 is a diagram for explaining a method for detecting electronic components in one of the embodiments of the present invention; and FIG. 6 is a flowchart of an operation sequence of the electronic component mounter in one of the embodiments of the present invention.

First, an overall configuration of an electronic component mounter is described with reference to FIG. 2, FIG. 3A and FIG. 3B. In FIG. 2, a transporting path 2 stretching in the X direction is placed in the approximately center of a base 1. The transporting path 2 transports a board 3 on which components are to be mounted and places it at a predetermined position. Note that in the present invention, the transportation direction of the board is the X direction, while the direction orthogonal to the X direction on a horizontal plane is the Y direction. On both sides in the Y direction of the transporting path 2, electronic component supply units 4 are placed. Each electronic component supply unit 4 includes a component feeder for supplying electronic components (hereinafter referred to as "components") to the mounter. In the present embodiment, plural tape feeders 5 are detachably arranged side by side. A lot of components are stored in the tape feeders 5.

A pair of Y tables 6 are placed at both ends in the X direction of the base 1. A pair of X tables 7 are set on these Y tables 6, and are driven by the Y tables 6 so as to move in the Y direction. A transfer head 8 is attached on the side of each X table 7, and is driven by the X table 7 so as to move in the X direction. The Y tables and X tables 7 are the horizontal moving unit for moving the transfer head 8 horizontally on the base 1.

In FIG. 3A and FIG. 3B, the transfer head 8 is attached to the X table 7 via a plate 9. Plural nozzle units 20 are attached to and held by the frame 10. In the present embodiment, two lines of nozzle units, each having four nozzle units 20 arranged in series, are placed in the Y direction.

In FIG. 3B, nozzles 21 are attached to the lower end of each nozzle unit 20. Each nozzle unit 20 includes, as units for driving the nozzle 21, an up-and-down drive unit 22 and a rotation drive unit 23 (see FIG. 4). The up-and-down drive unit 22 is made up of: a ball screw fixed in the vertical direction not shown in the diagram; a nut to be screwed with the ball screw; and a motor for rotating the ball screw axially, and the nozzle 21 is connected to this nut. Axial rotation of the ball screw moves the nut vertically, which causes up-and-down movement of the nozzle 21. As described above, by controlling the driving of the up-and-down drive unit 22 of each nozzle unit 20, the level (vertical position) of each nozzle 21 can be adjusted independently of other nozzles. Furthermore, since each nozzle 21 is driven by the rotation drive unit 23 to rotate independently of other nozzles, the horizontal orientation of a component sucked and held by each nozzle 21 can be changed.

In FIG. 3A and FIG. 3B, a first line sensor 13 is attached to the transfer head 8, and held at a fixed level at which the sensor 13 can detect the side of the component suction surface (hereinafter referred to as "suction surface") on the undersurface of each nozzle 21. This first line sensor 13 can move along the alignment of nozzles 21 while keeping the fixed level. When the first line sensor 13 is positioned at the side of a component P sucked and held by each nozzle 21, it detects the component P. The first line sensor 13 moves continuously so as to detect the components P in sequence. By doing so, the first line sensor 13 detects the height as well as the level of the mounting surface of each component P sucked and held by each nozzle 21. Note that a mounting surface is a surface of a component which comes into contact with the top surface of the board when the component is mounted on the board. A mounting surface is typically the undersurface of an electrode, but the mounting surface of a component with a bump is the undersurface of the bump. The first line sensor 13 serves as a second detecting means which detects the components sucked and held by a multi-nozzle unit from the sides of the components.

In FIG. 2, a second line sensor 14 is placed between the transporting path 2 and the electronic component supply unit 4, and detects the components sucked and picked up by the nozzles 21 of the transfer head 8 from beneath the components. This second line sensor 14 captures an image of the mounting surface of the component, and this image is processed by an image processing unit 39 (see FIG. 4) so as to detect the presence or absence of the component, the suction attitude of the component and the like. The second line sensor 14 serves as a first detecting means which detects the components sucked and held by the multi-nozzle unit from beneath the components.

Next, a configuration of a control system of an electronic component mounter is described with reference to FIG. 4. A control unit 30 is connected, via a bus 31, to the transporting paths 2, the Y tables 6, the X tables 7, the first line sensor 13, the second line sensor 14, and the drive systems, namely the up-and-down drive unit 22 and the rotation drive unit 23 of the nozzle unit 20, and it controls the driving of each drive system based on an NC program 37. The NC program is stored in a data unit 32 connected to the bus 31, and this data unit 32 stores a component library 33, nozzle data 34, board data 35, control parameters 36, in addition to the NC program 37. The component library 33 stores component size data 33a per component type. The nozzle data 34 stores reference level data 34a of each nozzle 21 which is the basis for measuring the height of a component. This reference level data 34a is the data indicating the level of the tip of the nozzle 21 used for measuring the height of a component, or the data indicating the down stroke from the upper limit of the level of the nozzle 21, and includes the level data of the suction surface of each nozzle 21. The control unit 30 is further connected to a calculation unit 38, an image processing unit 39, a display unit 40 and an operation/entry unit 41, via the bus 31.

Next, a method for detecting a component by the first line sensor 13 and the second line sensor 14 is described with reference to FIG. 5. FIG. 5 shows a positional relationship between components P sucked and held by respective nozzles 21, the first line sensor 13 and the second line sensor 14. Respective nozzles are holding components of different sizes. Here, tiny components are 0402, 0603 and 1005 chip components, they have minute differences in size such as length, width, height, and the like. Such tiny components further include 1608R and 2625R chip components and other chip components which do not have such minute differences in size but have the heights of 0.5 mm or less.

Note that in the present embodiment, above-mentioned tiny components are taken as an example of components to be sucked, but the present invention is not limited to such tiny components and any other components may be used.

Each nozzle 21 is driven by the up-and-down drive unit 22 so that the level of each nozzle 21 is adjusted based on its own reference level data 34a. The reference level of each nozzle 21 is set so that not only the side of each component P sucked and held by each nozzle 21 is positioned within a high-accuracy portion, namely, a detectable range (from the upper limit L1 to the lower limit L2) of the first line sensor 13 but also the mounting surface of each component P is positioned within a focus range (a detectable range) of the second line sensor 14. As mentioned above, the reference level of each nozzle 21 just has to be set so that the sucked component P is positioned within the above detectable range. Regardless of the size of a sucked component P, the up-and-down drive unit 22 is controlled so that the measurement level at which the height of each nozzle 21 is measured is kept at the reference level, and thus the height of the component P is detected using the high accuracy of the measurement level.

As for all the components P sucked and held by respective nozzles 21 which are adjusted to be positioned at their respective reference levels, the sides of these components P are positioned within the detectable range (the upper limit L1 to the lower limit L2) of the first line sensor 13 and the mounting surfaces of the components P are positioned within the focus range (detectable range) of the second line sensor 14. Therefore, by moving the first line sensor 13 horizontally along the sides of the components P while keeping the level constant, it becomes possible to continuously detect the levels of the mounting surfaces of these components P. Furthermore, by moving, in sequence, the components P sucked and held by respective nozzles 21 above the second line sensor 14, it becomes possible to continuously capture the images of the mounting surfaces of the components P.

The height of each component P is obtained by the calculation unit 38 by calculating the difference between the level of the mounting surface of the component P detected by the first line sensor 13 and the level of the suction surface of the nozzle 21 included in the reference level data 34a.

As described above, by lowering the component P sucked and held by each nozzle 21 to the level at which the first line sensor 13 can detect the component P with a high degree of accuracy, the first line sensor 13 can measure the height of the component P.

Second Embodiment

Next, another embodiment of the present invention is described.

The object of the second embodiment is as follows.

According to the method described in an already disclosed patent reference (Japanese Laid-Open Patent Application No. 2002-09496 Publication), the mounting surfaces of components P sucked and held by respective nozzles 21 are aligned with the level of the focus position of the second line sensor 14, regardless of the heights of respective components P, and therefore the levels of the nozzles 21 are adjusted so as to be the levels obtained by subtracting the heights of respective components P from the level of the focus position. More specifically, the level of each nozzle 21 is managed by an absolute value. The level of each nozzle 21 is adjusted by coupling the nozzle 21 with a nut screwed with a ball screw and controlling the axial rotation of this ball screw. Therefore, the error caused by machining accuracy of the ball screw has a direct impact on the up-and-down movement of the nozzle 21 when adjusting the level of the nozzle 21. This error is about ±50 μm with respect to a stroke of 300 mm, for example. Therefore, when the level of each nozzle 21 is managed by an absolute value, that level also includes the error of about ±50 μm.

With a recent reduction in size and weight of a component P, there are only minute differences in size between the height of the component P measured when it is sucked normally and the height measured when it is sucked abnormally (in such a manner as it is sucked obliquely). For example, the width and the oblique length of a 0603 chip tiny component P is 0.3 mm and 0.35 mm respectively, and the difference between them is 0.05 mm (i.e., 50 μm).

In other words, it must be judged whether such a tiny component P is sucked normally or abnormally by detecting the difference of only 50 μm accurately. Therefore, if the height of such a tiny component P sucked and held by the nozzle 21 including an error of the equivalent level is detected, the suction attitude of the tiny component P may be incorrectly detected.

So, the present embodiment shows, as an example, a method for accurately and efficiently detecting and measuring the height of an electronic component (particularly a tiny component) sucked and held by the nozzle 21. Note that the configuration of the electronic component mounter in the present embodiment is same as in the above first embodiment.

In order to detect components P which are sucked by each nozzle 21 which repeats mounting operation, the measurement level of each nozzle 21 is controlled so as to be a reference level predetermined for each nozzle 21. The height of a newly sucked component P is obtained by calculating the difference between the level of the mounting surface of the component P detected by the first line sensor 13 and the level of the suction surface of the nozzle 21 included in the reference level data 34a.

In other words, if components to be measured are tiny ones, it is possible to keep the measurement level of each nozzle 21 constant when the heights of the components are measured using the first line sensor 13.

If the measurement level of the nozzle 21 is kept constant, the nut of the up-and-down drive unit 22, as a nozzle level controlling unit, is repeatedly screwed with the ball screw at the same position. Therefore, it is possible to curb the influence of a mechanical error caused by the machining accuracies of these nut and ball screw. As a result, it becomes possible to reduce the variations in the measurement level of the suction surface of the nozzle 21 which is adjusted based on the reference level data 34a, and thus to measure the height of the component P with high accuracy.

Note that the reference level of each nozzle 21 can be set arbitrarily as long as the component P sucked and held by the nozzle 21 is positioned within the detectable ranges of the first line sensor 13 and the second line sensor 14 respectively. Since the measurement level of each nozzle 21 is independently adjusted so as to be its own reference level, the height of the component P sucked and held by each nozzle 21 can be measured with high accuracy.

Note that although the components P are shown bigger than they really are in FIG. 5, the actual sizes of the components P are very tiny, and there is no noticeable difference between their heights. Therefore, it is possible for the second line sensor 14 to continuously capture the images of the mounting surfaces of all the components P without horizontally aligning the mounting surfaces thereof.

Next, an operation sequence of an electronic component mounter is described with reference to FIG. 6. After mounting starts, the multi-nozzle unit is moved to pickup positions on the tape feeders 5 provided in the electronic component supply unit 4 so that respective nozzles 21 can suck up the components P (S1). After sucking up the components, the levels of the nozzles 21 are respectively adjusted to their reference levels (S2). Next, the first line sensor 13 is moved to detect the components P sucked and held by the nozzles from the sides thereof and to obtain the levels of the mounting surfaces of respective components P (S3). The nozzles 21 which have sucked up the components P are sequentially moved above the second line sensor 14 so that the second line sensor 14 can detect the components P from beneath respective components P and capture the images of the mounting surfaces thereof (S4). To be more specific, S3 and S4 are the processes to detect the components P sucked and held by the level-adjusted nozzles 21 of the multi-nozzle unit, from the sides of and from beneath the components P.

Next, the height of each component P is calculated from the difference between the level of the mounting surface of the component P detected in S3 and the level of the suction surface of the nozzle 21 included in the reference level data 34a, and is compared with the size data 33a in the component library 33. In the case where the calculated height of the component P exceeds the allowable range of the heights of the component P included in the size data 33a, it is judged that the component P is sucked and held in the abnormal attitude such as a standing position and a tilted position, not in the normal attitude with its mounting surface facing downward, and an abnormal suction process is performed (S5). The image of the mounting surface of each component P captured in S4 is processed by the image processing unit 39 based on the size data 33a. When it is judged that the component P cannot be mounted due to its wrong size and displacement, the abnormal suction process is performed (S6). The abnormal suction process is performed in S5 or S6, the component P is abandoned and a new component P is sucked (S1). The operations of the above S2 through S4 are repeated for this newly sucked component P, and when the number of detected abnormal suctions exceeds a predetermined number of times, such a condition is considered as an error and the machine is stopped.

When it is detected that the component P is sucked and held in the normal attitude in S3 and S4, the position of the component P is corrected by the horizontal movement, vertical movement and rotation of the nozzle 21 (S7), and then the component P is mounted in its mounting position on the board 3 (S8).

Hereinafter, the above mounting operations of S1 through S8 are repeated over and over until the mounting of the components is completed. The measurement level of each nozzle 21 for sucking a new component P in every repetition is adjusted to its own reference level (S2). In other words, S2 is the process where the level of each nozzle in the multi-nozzle unit for repeatedly sucking a new electronic component in every repetition of mounting operations is adjusted to its own reference level predetermined for each nozzle.

The components may be detected by the first line sensor 13 (S3) before they are detected by the second line sensor 14 (S4), and vice versa. Both detections may be performed at the same time. Since the first line sensor 13 is attached to the transfer head 8 in the present embodiment, the components can be detected while the transfer head 8 is moving. In other words, the components P can be detected by the first line sensor 13 while the nozzles 21 which suck and hold the components P are moving above the second line sensor 14 and the board 3. Therefore, the speed and efficiency of mounting operations can be improved. Note that the components can also be detected by placing the first line sensor 13 on the base 1 and moving the transfer head 8 along the side of the first line sensor 13.

As described above, according to the electronic component mounter and mounting method of the present invention, it is possible to measure the heights of the components sucked and held by respective nozzles of the multi-nozzle unit using the high accuracy of measurement levels of the nozzles, and to continuously detect the components sucked and held by the multi-nozzle unit. Therefore, the components can be detected with high efficiency and accuracy, and thus not only defective board can be prevented but also the performance of the mounter can be enhanced.

Third Embodiment

Next, a method for detecting components by the first line sensor 13 and the second line sensor 14 is described with reference to FIG. 7. In the present embodiment, components to be mounted are classified into first components and second components, and the first components and the second components are respectively detected by different detection methods. Note that the configuration of the electronic component mounter in the present embodiment is same as that in the above first and second embodiments.

In the present embodiment, the first components are tiny components such as 0402, 0603 and 1005 chip capacitors, and they have minute differences in size such as length, width, height, oblique length and the like. Such tiny components further include 1608R and 2625R chip capacitors and other chip components which do not have such minute differences in size but have the heights of 0.5 mm or less. On the other hand, the second components are relatively large components which are not classified as the first components. The heights of the first components do not vary significantly from type to type, while the heights of the second components vary greatly among types.

Figure 7A:
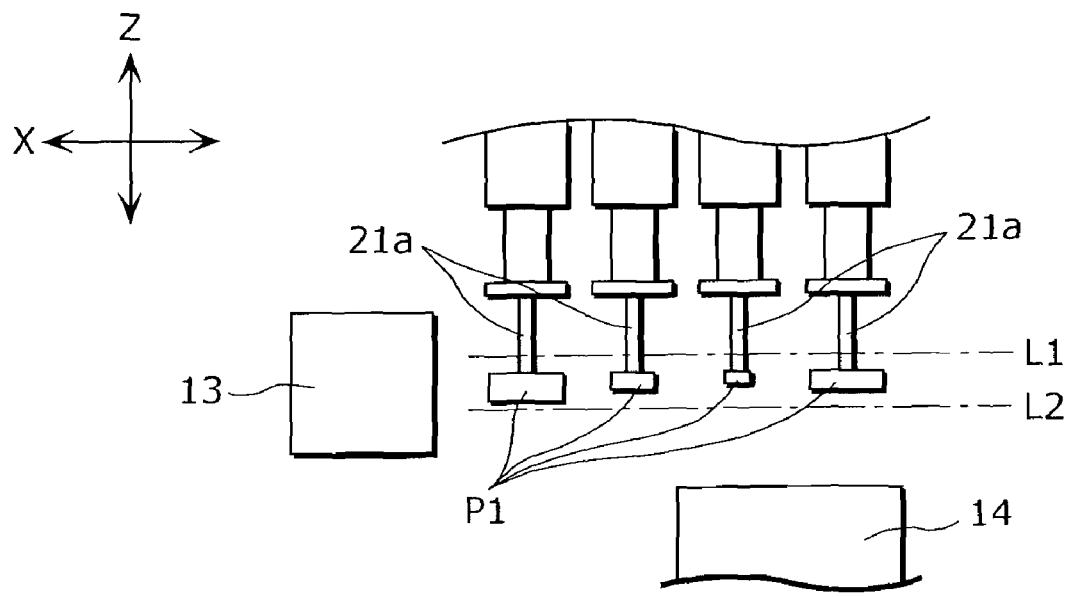
FIG. 7A is a diagram for explaining the first method for detecting electronic components in one of the embodiments of the present invention.

First, a method for detecting the first components is described with reference to FIG. 7A. FIG. 7A shows a positional relationship between the first components P1 sucked and held by respective nozzles 21a, the first line sensor 13 and the second line sensor 14.

Respective nozzles 21a hold the first components P1 of different sizes. Each nozzle 21a is driven by the up-and-down drive unit 22 so that the level thereof is adjusted based on its own reference level data 34a of the nozzle 21. The reference level of each nozzle 21a is set so that not only the side of each first component P1 sucked and held by each nozzle 21a is positioned within a detectable range (from the upper limit L1 to the lower limit L2) of the first line sensor 13 but also the mounting surface of each first component P1 is positioned within a focus range (a detectable range) of the second line sensor 14.

As for all the first components P1 sucked and held by respective nozzles 21a which are adjusted to be positioned at their respective reference levels, the sides of these first components P1 are positioned within the detectable range (the upper limit L1 to the lower limit L2) of the first line sensor 13 and their mounting surfaces are positioned within the focus range (detectable range) of the second line sensor 14. Therefore, by moving the first line sensor 13 along the sides of the first components P1 while keeping a fixed level, it is possible to continuously detect the levels of the mounting surfaces of respective first components P1. Furthermore, by moving, in sequence, the first components P1 sucked and held by respective nozzles 21a above the second line sensor 14, it becomes possible to continuously capture the images of the mounting surfaces of respective first components P1.

The height of each first component P1 is obtained by the calculation unit 38 by calculating the difference between the level of the mounting surface of the first component P1 detected by the first line sensor 13 and the level of the suction surface of the nozzle 21a included in the reference level data 34a.

In order to detect the first components P1 which are sucked by each nozzle 21a which repeats mounting operation, the measurement level of each nozzle 21a is controlled so as to be the reference level for the nozzle 21a. The height of a newly sucked first component P1 is obtained by calculating the difference between the level of the mounting surface of the first component P1 detected by the first line sensor 13 and the level of the suction surface of the nozzle 21a included in the reference level data 34a.

In other words, if a component to be measured is a tiny one like a first component P1, it is possible to keep the measurement level of the nozzle 21a constant when the height of the component is measured using the first line sensor 13.

If the measurement level of the nozzle 21a is kept constant, the nut of the up-and-down drive unit 22, as a nozzle level controlling unit, is repeatedly screwed with the ball screw at the same position. Therefore, it is possible to curb the influence of a mechanical error caused by the machining accuracies of these nut and ball screw. As a result, it becomes possible to reduce the variations in the measurement level of the suction surface of the nozzle 21a which is adjusted based on the reference level data 34a, and thus to measure the height of the first component P1 with high accuracy.

Note that the reference level of the nozzle 21a can be set arbitrarily for each nozzle 21a as long as the first component P1 sucked and held by the nozzle 21a is positioned within the detectable ranges of the first line sensor 13 and the second line sensor 14 respectively. Since the measurement level of each nozzle 21a is independently adjusted so as to be the reference level, the level of the first component P1 sucked and held by each nozzle 21a can be measured with high accuracy.

Note that although the first components P1 are shown bigger than they really are in FIG. 7A, the actual sizes of the first components P1 are very tiny, and there is no noticeable difference between their heights. Therefore, it is possible for the second line sensor 14 to continuously capture the images of the mounting surfaces of all the first components P1 without horizontally aligning the mounting surfaces thereof.

Figure 7B:
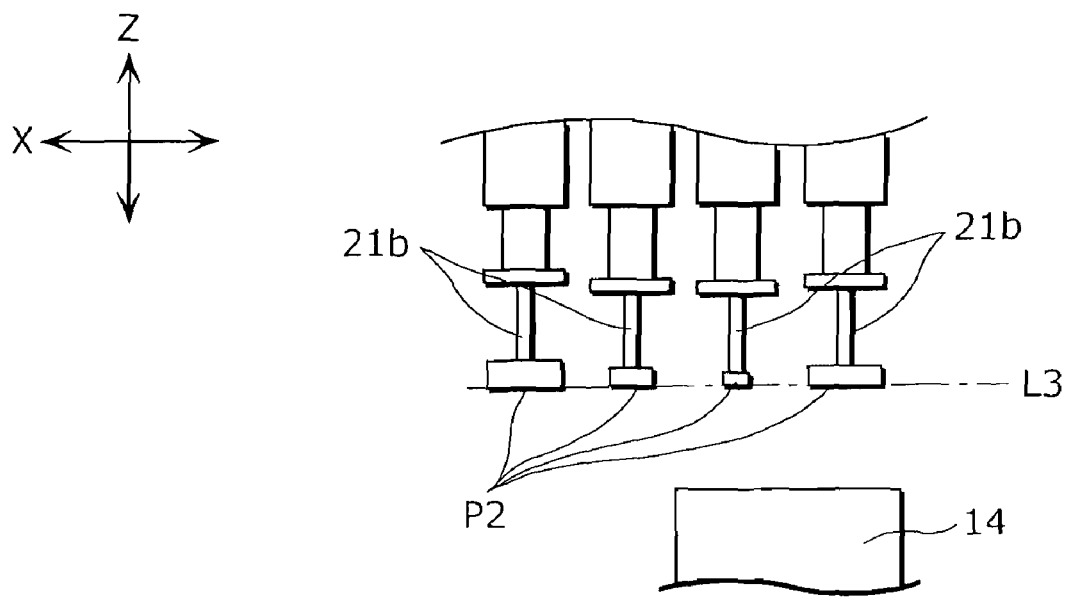
FIG. 7B is a diagram for explaining the second method for detecting electronic components in one of the embodiments of the present invention.

Next, a method for detecting the second components is described with reference to FIG. 7B. FIG. 7B shows a positional relationship between the second components P2 sucked and held by respective nozzles 21b and the second line sensor 14. Respective nozzles 21b hold the second components P2 of different sizes.

Each nozzle 21b is driven by the up-and-down drive unit 22 so that the level thereof is adjusted based on the size data 33a of each second component P2 and the levels of the mounting surfaces of all the second components P2 are horizontally aligned at the level L3. The level L3 is set to a value within the focus range (detectable range) of the second line sensor 14, and by moving, in sequence, the second components P2 sucked and held by respective nozzles 21b above the second line sensor 14, it becomes possible to continuously capture the images of the mounting surfaces of respective second components P2.

As mentioned above, by aligning, on the horizontal plane, the mounting surfaces of respective second components P2 which significantly vary in height from type to type, the second line sensor 14 can continuously detect the second components P2. Note that the reference numbers 21a and 21b are assigned to the nozzles 21 for illustrative purpose, and both the nozzles 21a and the nozzles 21b are the same nozzles 21.

Figure 8:
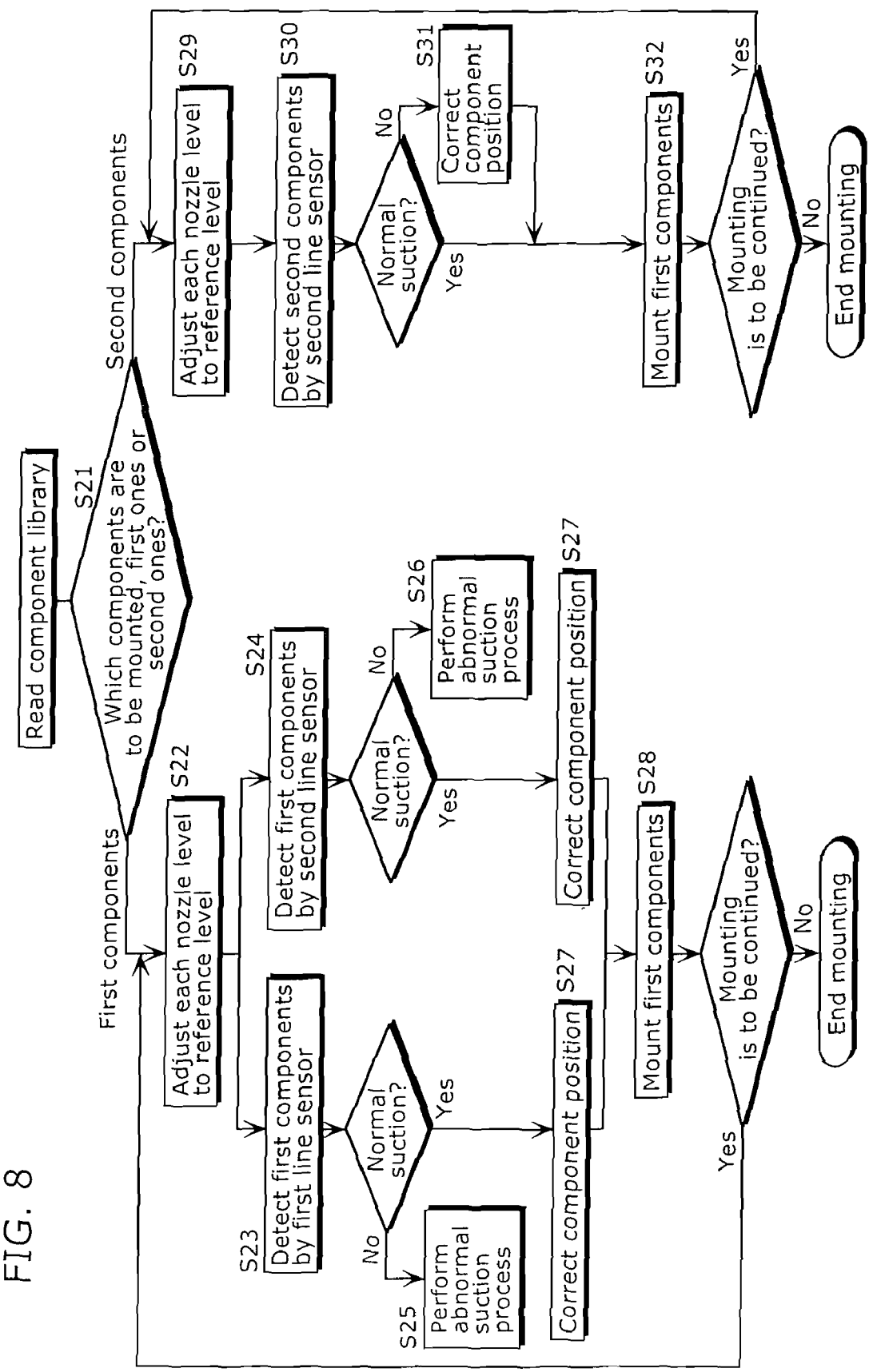
FIG. 8 is a flowchart of an operation sequence of the electronic component mounter in one of the embodiments of the present invention.

Next, operations of an electronic component mounter is described with reference to FIG. 8. First, it is judged whether components to be mounted are the first components or the second components (S21). If the components to be mounted are the first components, the levels of the nozzles 21 are respectively adjusted to their reference levels after sucking up the components (S22). Next, the first line sensor 13 is moved to detect the first components P1 sucked and held by the nozzles from the sides thereof and to obtain the levels of the mounting surfaces of respective first components P1 (S23). The nozzles 21 which have sucked up the first components P1 are sequentially moved above the second line sensor 14 so that the second line sensor 14 can detect the first components P1 from beneath them and capture the images of the mounting surfaces of respective first components P1 (S24). To be more specific, S23 and S24 are the first detection process for detecting the first components sucked and held by the level-adjusted nozzles 21 of the multi-nozzle unit, from the sides and undersurfaces of the first components.

Next, the height of each first component P1 is calculated based on the difference between the level of the mounting surface of the first component P1 detected in S23 and the level of the suction surface of the nozzle 21 included in the reference level data 34a, and is compared with the size data 33a in the component library 33. In the case where the calculated height of the first component P1 exceeds the allowable range of the heights of the first component P1 included in the size data 33a, it is judged that the first component P1 is sucked and held in the abnormal attitude such as a standing position and a tilted position, not in the normal attitude with its mounting surface facing downward, and an abnormal suction process is performed (S25). The image of the mounting surface of each first component captured in S24 is processed by the image processing unit 39 based on the size data 33a. When it is judged that a component cannot be mounted in a right position due to a wrong size or displacement of the component, the abnormal suction process is performed (S26). The abnormal suction process is performed in S25 or S26, the first component is abandoned and a new first component is sucked (S21). The operations of the above S22 through S24 are repeated for this newly sucked first component, and when the number of detected abnormal suctions exceeds a predetermined number of times, such a condition is considered as an error and the machine is stopped.

When it is detected that the first component is sucked and held in the normal attitude in S23 and S24, the position of the first component is corrected by the horizontal movement, vertical movement and rotation of the nozzle 21 (S27), and then the first component is mounted in its mounting position on the board 3 (S28).

Hereinafter, the above mounting steps of S21 through S28 are repeated until the mounting operation is completed. The measurement level of each nozzle 21 for sucking a new component P in every repetition is adjusted to its own reference level (S22). In other words, S22 is the first adjustment process where the level of each nozzle in the multi-nozzle unit for repeatedly sucking a new electronic component in every repetition of mounting operations is adjusted to its own reference level predetermined for each nozzle.

On the other hand, if the components to be mounted are the second components, the levels of the nozzles 21 are respectively adjusted based on the size data 33a and the levels of the mounting surfaces of all the second components are horizontally aligned at the same level (S29). S29 is the second adjustment process where the level of each nozzle of the multi-nozzle unit is adjusted so that the levels of the mounting surfaces of all the second components sucked and held by the nozzles are horizontally aligned at the same level.

Next, the nozzles 21 which have sucked Lip the second components are sequentially moved above the second line sensor 14 so that the second line sensor 14 can detect the second components from beneath them and capture the images of the mounting surfaces of respective second components (S30). S30 is the second detection process for detecting, from the undersurfaces of the second components, the second components with their mounting surfaces being aligned at the same level.

The image of the mounting surface of each second component captured in S30 is processed by the image processing unit 39 based on the size data 33a, and if an abnormal suction such as a positional deviation is detected, the position of the second component is corrected by the rotation driving or horizontal movement of the nozzle 21 (S31). The second component which is detected to be sucked and held in the normal attitude or which is position-corrected in S30 is mounted in its mounting position on the board 3 (S32). Hereinafter, the above mounting steps of S29 through S32 are repeated until the mounting operation is completed.

The components may be detected by the first line sensor 13 (S23) before the components are detected by the second line sensor 14 (S24), and vice versa. Both detections may be performed at the same time. In the present embodiment, since the first line sensor 13 is attached to the transfer head 8, the components can be detected while the transfer head 8 is moving. In other words, the first components can be detected by the first line sensor 13 while the nozzles 21 which suck and hold the first components are moving above the second line sensor 14 and the board 3. Therefore, the speed and efficiency of mounting operations can be improved. Note that the components can also be detected by placing the first line sensor 13 on the base 1 and moving the transfer head 8 along the side of the first line sensor 13.

As described above, according to the electronic component mounter and mounting method of the present invention, the component detection methods are different between the types of the components to be mounted, namely the first components and the second components. Therefore, the components to be mounted can be detected by a detection method appropriate for the type of the components. In addition, as for the first components which are tiny components, it is possible to measure the heights of the components sucked and held by respective nozzles of the multi-nozzle unit using the high accuracy of measurement levels of the nozzles, and to continuously detect the components sucked and held by the multi-nozzle unit. Therefore, the components can be detected with high efficiency and accuracy, and thus not only defective board can be prevented but also the performance of the mounter can be enhanced.

Fourth Embodiment

Next, an embodiment of the present invention is described with reference to drawings. In the present embodiment, the detailed measurement method for common components, other than tiny components which have described in the above third embodiment, is described.

Figure 9:
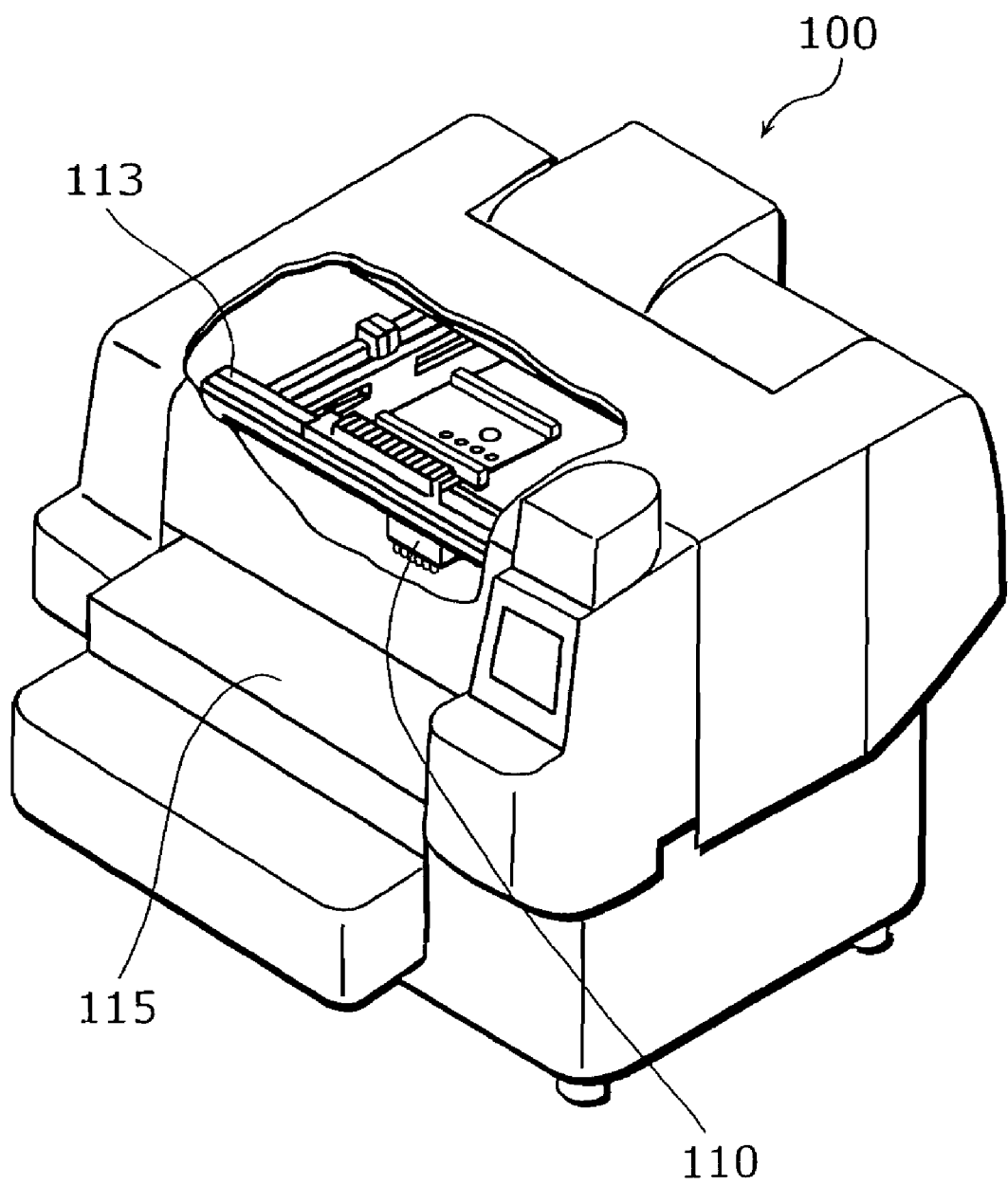
FIG. 9 is an external perspective view of the electronic component mounter according to one of the embodiments of the present invention, with a cutaway view of the inside of the mounter.

FIG. 9 is an external perspective view of a component mounter 100 according to an embodiment of the present invention, with a cutaway view of the inside of the mounter.

The mounter 100 shown in the diagram can be incorporated into a mounting line, and is an apparatus which mounts, onto a board, electronic components received from the upper stream of the mounting line, and sends out, to the lower stream, a circuit board which is the board on which the electronic components have already been mounted. Such mounter 100 is equipped with nozzles which hold the electronic components by means of vacuum suction, and includes a transfer head 110 equipped with nozzle units which transports the sucked and held components onto the board, an XY robot unit 113 which moves the transfer head 110 in a horizontal direction, and a component supply unit 115 which supplies the nozzle units 112 with the components.

More precisely, the mounter 100 is a mounter which can mount, on a board, various electronic components including tiny components and larger components such as connectors, and is a high-speed multifunctional mounter which can mount various electronic components including tiny components such as resistors and capacitors and larger IC components such as Quad Flat Packages (QFP) and Ball Grid Arrays (BGA).

Figure 10:
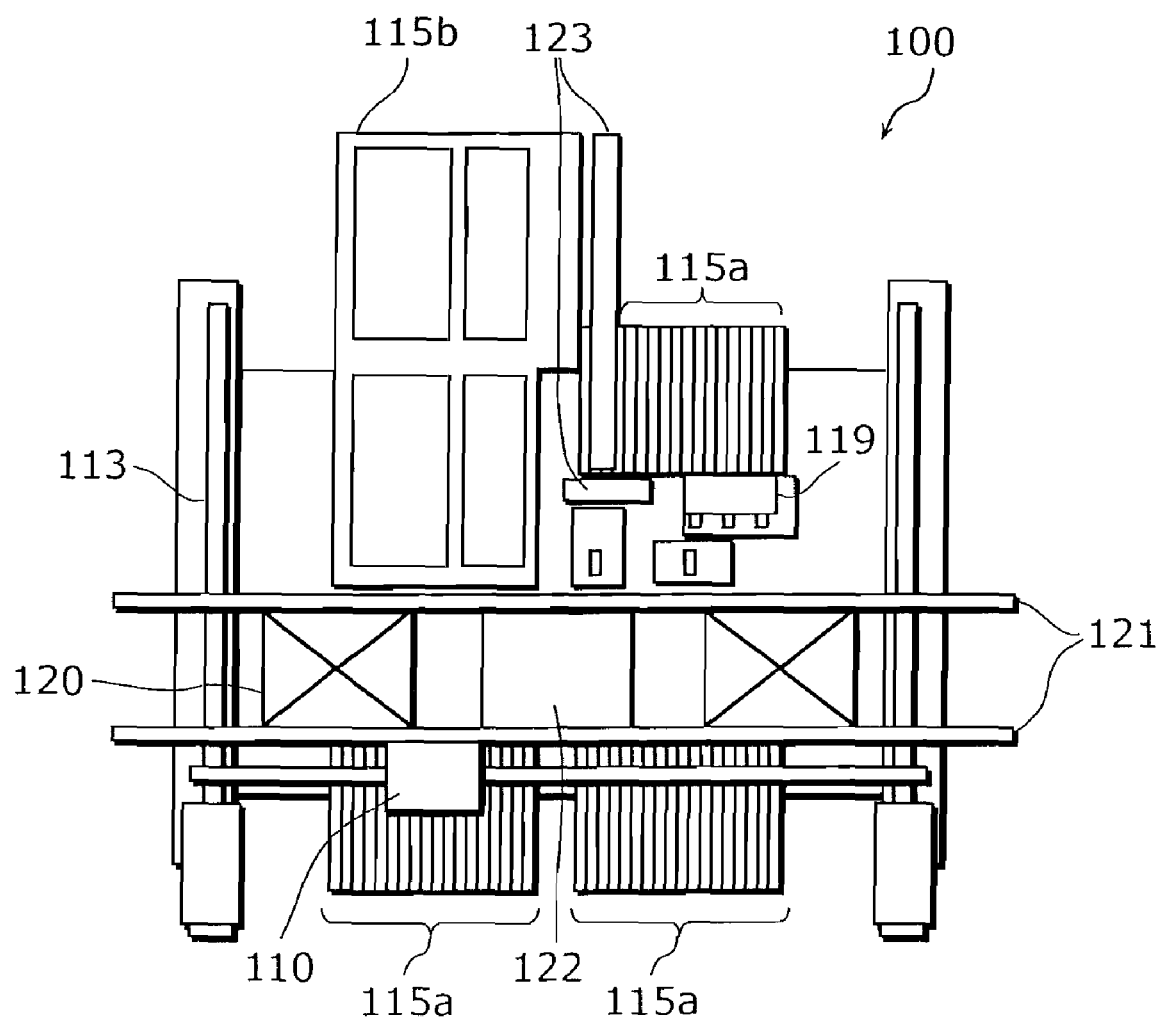
FIG. 10 is a plane view showing the internal configuration including the main elements of the electronic component mounter.

FIG. 10 is a plane view showing the main internal configuration of the component mounter 100.

The mounter 100 further includes: a nozzle station 119 in which nozzles for replacement which are to be attached to the nozzle units 112 are stored to be adaptive to various types and shapes of components; a rail 121 forming a path for transporting a board 120; a mounting table 122 on which the board 120 is placed for mounting the electronic components onto the transported board 120; and a component collecting apparatus 123 which collects the electronic component in the case where the sucked and held components are defective.

The component supply unit 115, which is set in the front and at the back of the mounter 100, includes component supply units 115a made up of supply cassettes for supplying the electronic components placed in tapes, and a component supply unit 115b which supplies the electronic components placed in a plate with partitions applied according to the size of the components.

Figure 11B:
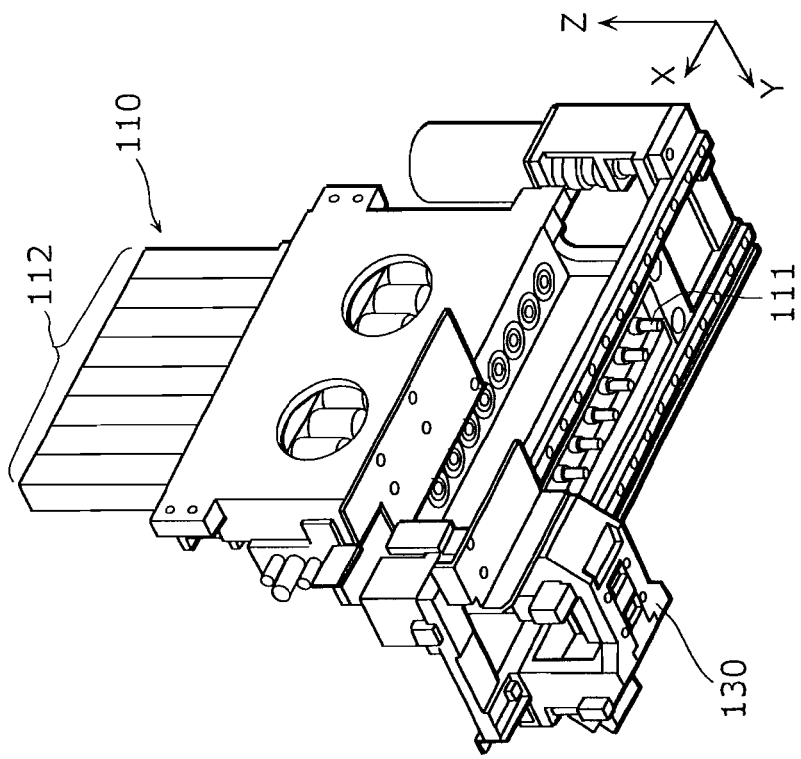
FIG. 11B is a bottom perspective view of the transfer head.
Figure 11A:
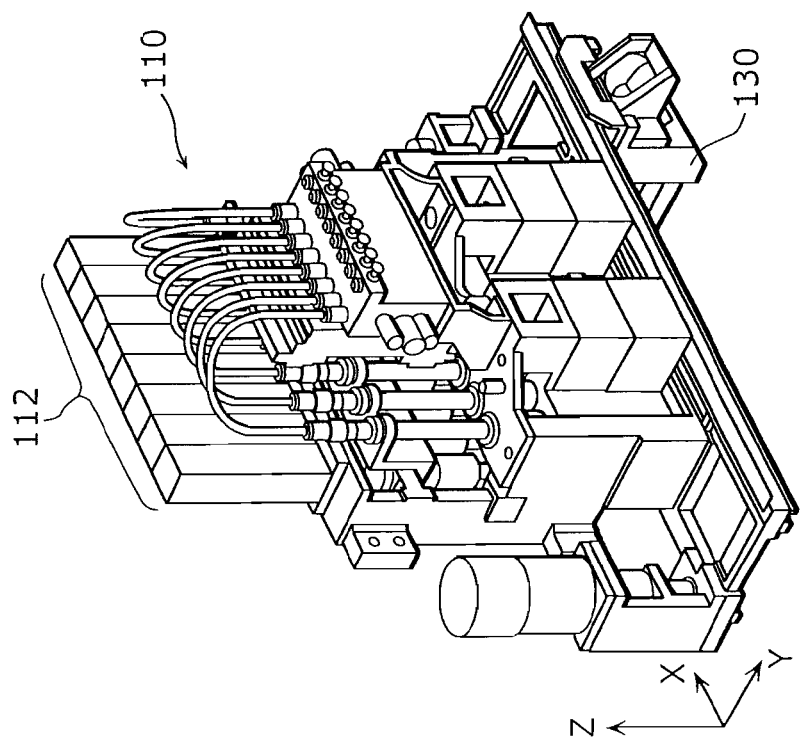
FIG. 11A is a top perspective view of a transfer head.

FIG. 11 is a perspective view of the transfer head 110, and particularly FIG. 11A is a top perspective view and FIG. 11B is a bottom perspective view of the transfer head 110.

As shown in FIG. 11, the transfer head 110 is a unit which obtains a plurality of electronic components from the component supply unit 115, transports these electronic components above the board, and mounts them in predetermined positions on the board, and includes: a plurality of nozzle units 112; nozzles 111 as holding units which are attached to respective nozzle units 112 in an replaceable manner; and a scan measurement unit 130 which can move in the direction of the alignment of nozzle units 112.

The nozzle unit 112 is a unit which can suck and hold one electronic component, and has a drive mechanism for driving the nozzle 111 vertically and a mechanism for vacuum suction of electronic components using the nozzle 111.

The nozzle 111 has a tip which fits for the shape of an electronic component to be sucked, and is equipped with an aperture for vacuum suction of the component. As mentioned above, the nozzle 111 can be exchanged to another depending on an electronic component to be held.

The scan measurement unit 130 is a U-shaped member which can move in the X direction in FIG. 10 below and along the sides of electronic components while the nozzles 111 is holding the components.

Figure 12:
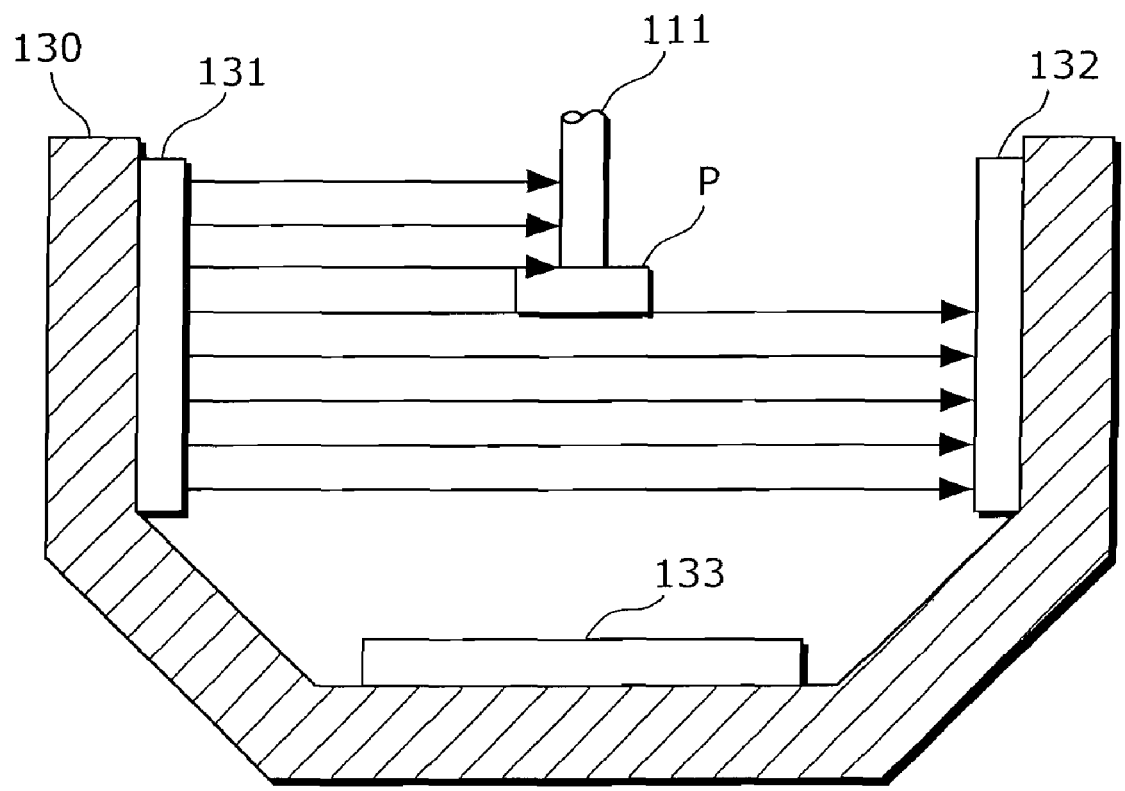
FIG. 12 is a conceptual side view showing a projector and a line sensor attached to a scan measurement unit.

FIG. 12 is a side view schematically showing a projector 131 and a first line sensor 132 attached to the scan measurement unit 130.

As shown in FIG. 12, the scan measurement unit 130 is equipped with, on one side wall, the projector 131 for projecting light inward the scan measurement unit 130, and, on the other side wall, the vertically placed first line sensor 132 for receiving the light projected from the projector 131.

Note that FIG. 12 schematically shows the scan measurement unit 130 viewed from the X direction in FIG. 11. 111 in FIG. 12 denotes a nozzle, and P denotes an electronic component to be sucked by the nozzle 111.

Furthermore, the scan measurement unit 130 is equipped with, on the bottom, a second line sensor 133 which faces the undersurface of the electronic component held by the nozzle 111 so as to capture the image of the component.

The first line sensor 132 is a one-dimensional sensor on which light-receiving elements are vertically placed, and has an ability to specify, with high resolution (for example, a resolution of 10 μm), the vertical positions where the light (horizontal light beams) from the projector 131 are blocked.

However, the property of the first line sensor 132 brings, in its central component, high resolution as well as high reliability in repeatability and the like, but tends to have reduced resolution and reliability toward both ends of the first line sensor 132. Furthermore, the measurable range of the first line sensor 132 in the present embodiment is a range in which the height of a large electronic component P cannot be measured (for example, 3 mm).

Figure 13:
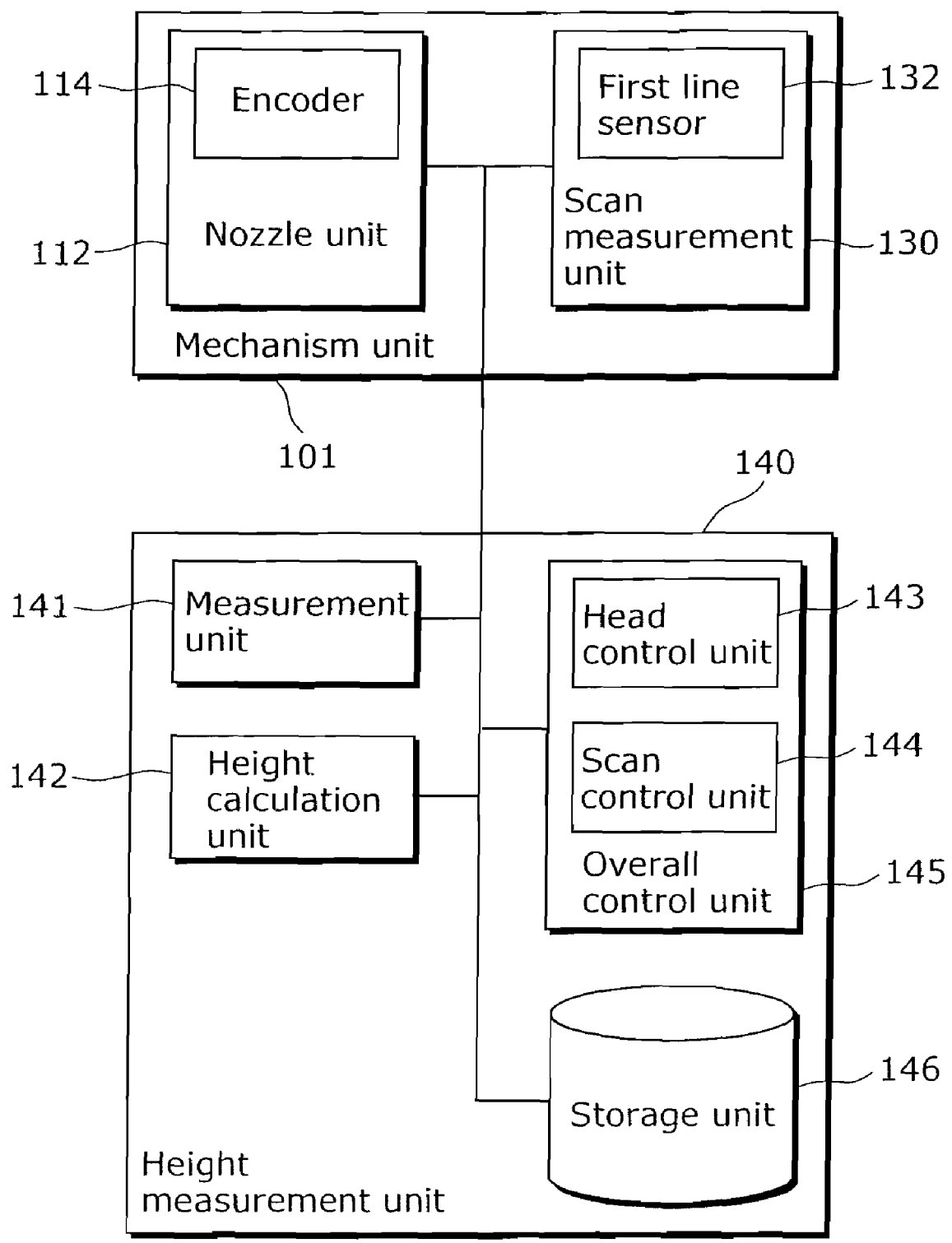
FIG. 13 is a functional block diagram showing a functional configuration of the electronic component mounter.

FIG. 13 is a functional block diagram showing a functional configuration of the component mounter 100.

As shown in this diagram, the component mounter 100 includes a mechanism unit 101 which lowers an electronic component P and scans the scan measurement unit 130 in order to measure the height of the electronic component P; and a height measurement unit 140 which controls this mechanism unit 101 to measure the height of the electronic component P.

The mechanism unit 101 includes, as mentioned above, the nozzle unit 112 which moves the nozzle 111 up and down and is equipped with an encoder 114 which outputs an amount of lowering of the nozzle 111 as a digital signal; and the scan measurement unit 130 which is equipped with the first line sensor 132 and can slide in the direction toward the nozzle unit 112.

Note that although the mechanism unit 101 of the mounter 100 is equipped with other devices and the like, the description thereof is omitted. Furthermore, this mechanism unit 101 also has a function of mounting electronic components P on the board 120.

A height measurement unit 140 is made up of a computer and its peripheral equipment, which controls the mechanism unit 101 to cause it to perform the operations required for measuring the height of an electronic component P, analyzes the data obtained from the mechanism unit 101 to calculate the height of the electronic component P, and stores it. The height measurement unit 140 includes: a measurement unit 141 which obtains a signal from the encoder 114 in the nozzle unit 112 and a signal from the first line sensor 132 in the scan measurement unit 130; a height calculation unit 142 which analyzes the signals and the like obtained by the measurement unit 141 and calculates the height of the electronic component P; a head control unit 143 which controls the movement of the nozzle unit 112; a scan control unit 144 which controls the movement of the scan measurement unit 130; an overall control unit 145 which controls both of the above two control units 143 and 144; and a storage unit 146.

The head control unit 143 is a processing unit which controls the vertical movement of the nozzle 111 attached to the nozzle unit 112. To be more specific, the head control unit 143 obtains, via the measurement unit 141, a signal from the encoder 114 in the nozzle unit 112, performs feedback control based on the signal, and controls the vertical position of the nozzle 111 with high accuracy (for example, 1 μm) so that the nozzle 111 is lowered by a set value obtained by the head control unit 143, namely, a set amount of lowering of the nozzle 111 which is previously inputted and stored in the storage unit 146.

The scan control unit 144 is a processing unit which controls the movement of the scan measurement unit 130 in the alignment direction of the nozzle units 112, and has a function of controlling the stop and moving direction of the scan measurement unit 130 as well as of specifying the nozzle unit 112 which holds the electronic component P which is being measured by the first line sensor 132.

The nozzle unit 112 can be specified by, for example, a method for specifying the component P which is currently being measured, by associating the amount of movement of the scan measurement unit 130 with the position of each nozzle 111 in the scan direction, a method for specifying the components to be measured and the order of the measurement in the moving direction of the scan measurement unit 130, or the like.

The overall control unit 145 is a processing unit for controlling, based on a program stored in the storage unit 146, the head control unit 143 and the scan control unit 144 so that they can measure the components tentatively in the case of a tentative measurement, and controlling the head control unit 143 and the scan control unit 144 so that they can measure the components definitively in the case of a definitive measurement. The overall control unit 145 judges the height of the electronic component P for the tentative measurement, and controls the head control unit 143 for the definitive measurement in accordance with the judgment result in the tentative measurement.

Here, the tentative measurement is a process for lowering the nozzle 111 so that the undersurface of a component P comes within the measurement range of the first line sensor 132, and tentatively measuring the height of the component P by the first line sensor 132.

The definitive measurement is a process for lowering the nozzle 111 so that the undersurface of the component P is positioned within the high-accuracy range of the first line sensor 132 based on the height of the component P obtained in the tentative measurement, and definitively measuring the height of the component P by the first line sensor 132.

The measurement unit 141 is an interface which receives signals from the encoder 114 and the first line sensor 132, as well as a processing unit which converts the signals into signals (signals indicating the actual height) which can be easily handled by the height measurement unit 140.

The height calculation unit 142 is a processing unit which calculates the height of an electronic component P based on a signal from the measurement unit 141 and the like.

The storage unit 146 holds a program for causing the height measurement unit 140 to execute each of its processing operations. The storage unit 146 also includes an identifier for identifying each electronic component P, and stores the value calculated by the height measurement unit 142 and the identifier of the corresponding electronic component P in association with each other.

Next, a description is given about a method for measuring the height of an electronic component P using the mounter 100 structured as mentioned above.

Figure 14:
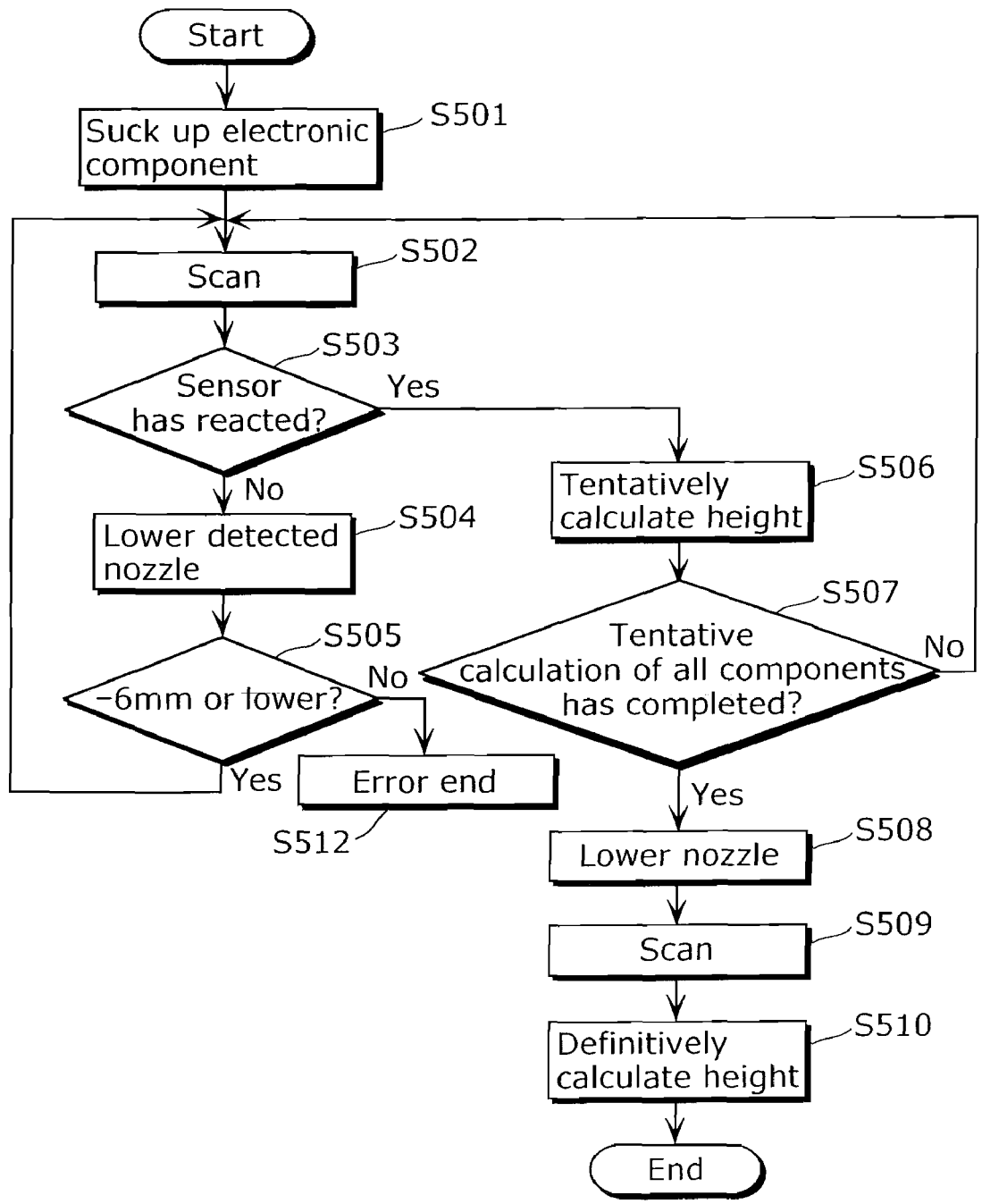
FIG. 14 is a flowchart of an operation sequence of the electronic component mounter.

FIG. 14 is a diagram showing an operation sequence performed by the mounter 100.

First, the nozzle 111 sucks up an electronic component P from the component supply unit 115 (S501). The transfer head 110 in the present embodiment can suck and hold up to eight electronic components, and the following description is given on the assumption that a plurality of electronic components P are sucked and held.

Next, the scan control unit 144 moves the scan measurement unit 130 in the alignment direction of the nozzle units 112 so that the scan measurement unit 130 scans the electronic components P held by the transfer head 110 (S502).

Figure 15:
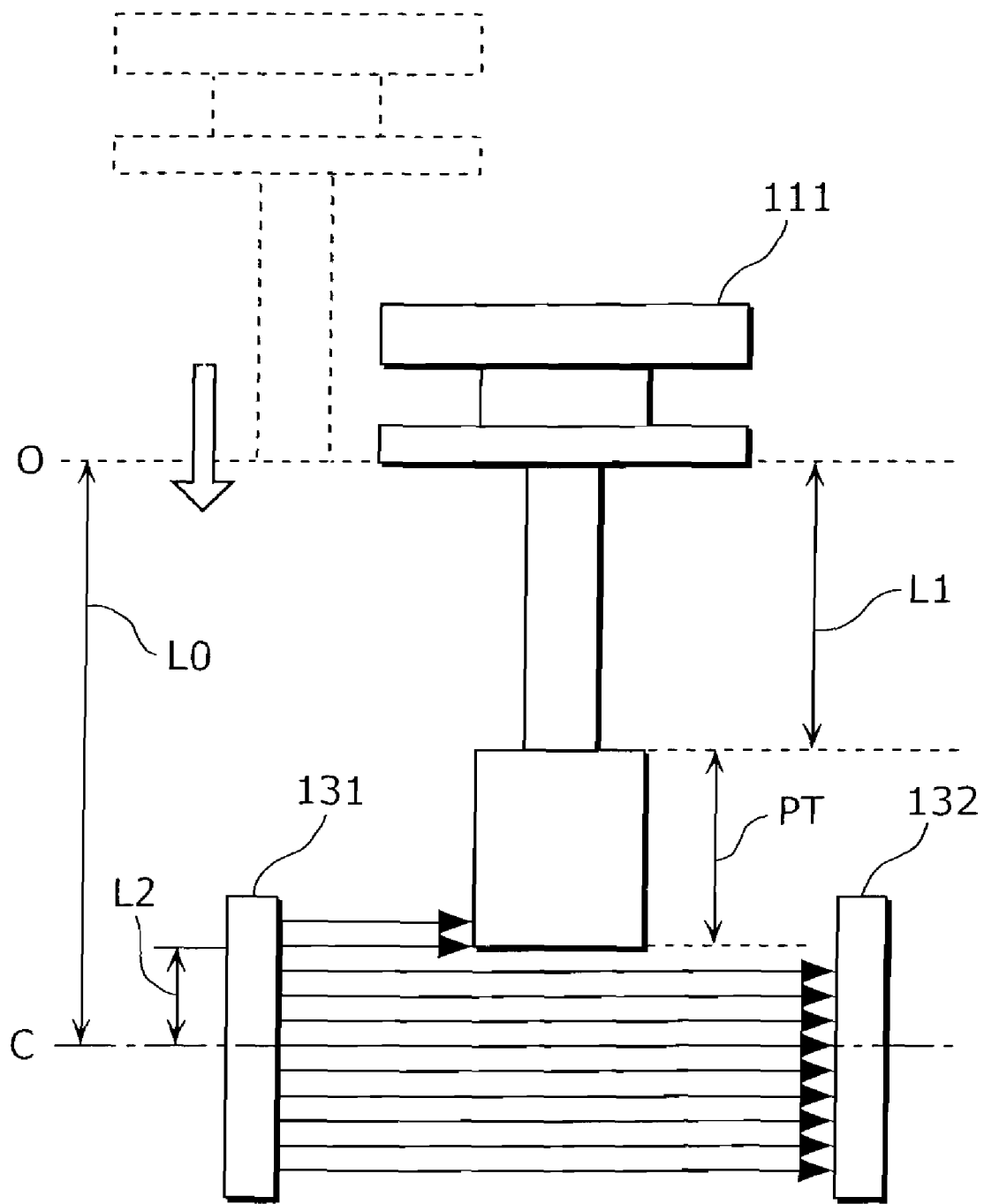
FIG. 15 is a side view showing a tentative measurement of an electronic component.

Next, as shown in FIG. 15, in the case where the first line sensor 132 reacts to the scanning (S502) (Y in S503), namely, in the case where the first line sensor 132 detects that there is a portion where the light from the projector 131 is blocked (Y in S503), the height calculation unit 142 tentatively calculates the height of the electronic component P based on a signal from the first line sensor 132 and a signal from the encoder in the nozzle unit 112 (S506), and the calculated height is tentatively held in the storage unit 146.

To be more specific, the measurement unit 141 receives the signal from the first line sensor 132 when the light from the projector 131 is blocked, and transmits a signal regarding L2 shown in FIG. 15 to the height calculation unit 142. The measurement unit 141 also receives the signal from the encoder in this situation, and transmits a signal regarding L1 shown in FIG. 15 to the height calculation unit 142. Note that L1 is an amount of lowering of the nozzle 111 from the original position ("0" in FIG. 15) which is the basis for calculation of the amount of lowering of the nozzle 111 to the position at which the first line sensor 132 has reacted. L2 is a distance from the vertical reference position of the first line sensor 132 ("C" in FIG. 15) to the lowest position of the range where the light is blocked.

Note that a predetermined range including portions above and below the above-mentioned vertical reference position is the high sensitivity portion of the first line sensor 132.

The height calculation unit 142 obtains the signals regarding L1 and L2 from the measurement unit 141, and tentatively calculates the height of the electronic component P according to the equation PT (Height of electronic component P)=L0−L1−L2, based on the predetermined distance L0 (6 mm in the present embodiment) between the original position 0 and the reference position C of the first line sensor 132. Here, since L2 is a value obtained at around both ends of the first line sensor 132, the accuracy of such measurement is low and thus the value includes a large error.

The above-mentioned process operations are performed for all the nozzles 111 equipped in the transfer head 110.

On the other hand, in the case where there is no reaction in the first line sensor 132 (N in S503) even if the above-mentioned scanning is performed, the head control unit 143 further lowers only the nozzle 111 which is in a position where the sensor cannot react (for example, additional 1 mm down) (S504).

The above-mentioned processes (S502 through S505) are repeated until the heights of all the electronic components P held by the nozzles 111 are tentatively calculated (S507).

As a result of the above processes, the tentatively calculated heights of all the electronic components P are stored in the storage unit 146 (S506).

Note that FIG. 15 does not show the default state but shows the state after the nozzle 111 is lowered to some extent. In addition, the nozzles 111 are gradually lowered because all the nozzles 111 are in the stationary state at a certain level so that the scan measurement unit 130 scans all the electronic components P from the sides thereof and measures their heights sequentially.

Figure 16:
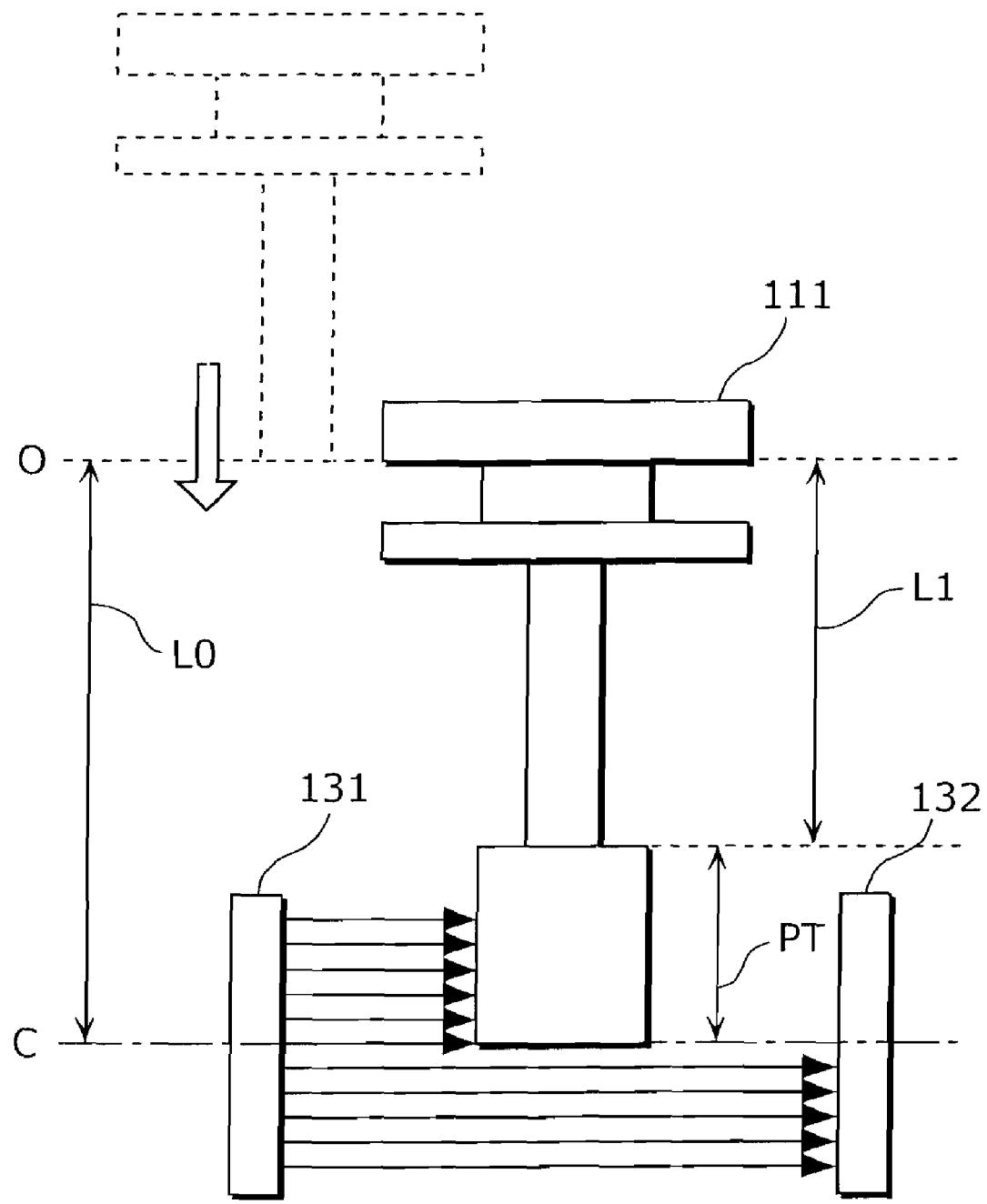
FIG. 16 is a side view showing a definitive measurement of the electronic component.

After the heights of all the components are tentatively calculated, the head control unit 143 controls each nozzle unit 112 so as to lower each nozzle 111 based on the signal from the encoder 114 so that the undersurface of the electronic component P held by each nozzle 111 is positioned at the reference position of the first line sensor 132 (the position lower than the original position 0 by 6 mm) based on the tentatively calculated value, as shown in FIG. 16 (S508).

Next, the scan control unit 144 controls the scan measurement unit 130 so as to move it, while the measurement unit 141 measures the position of the undersurface of each electronic component P using the first line sensor 132 (S509).

Finally, the height calculation unit 142 definitively measures the height of each electronic component P based on the value measured by the first line sensor 132 and the amount of lowering of the nozzle 111 (signal from the encoder) (S510).

The height of each electronic component P is measured by the same method as above, namely the height of each electronic component P is definitively calculated by the equation PT=L0−L1−L2. Here, since the undersurface of each electronic component P is positioned around the most sensitive reference position C of the first line sensor (L2≈0) where the height of the electronic component P can be definitively measured with highest accuracy, L2 is more accurate and includes just a small error. Note that in FIG. 16, the undersurface of the electronic component P is perfectly positioned at the reference position C, but it may be positioned apart from the reference position C by the error produced from the tentative calculation.

Above-mentioned configuration and processes allow measurement of the heights of various electronic components P from small components to larger ones based on the amount of lowering of each nozzle 111, even using a relatively small-sized first line sensor 132. In addition, since the first line sensor 132 definitively measures the height in its most sensitive portion, a highly accurate value can be obtained.

The mounter 100 performs this height measurement and the mounter 100 can use the value obtained by its measurement. In other words, since there is no human intervention, manpower can be saved and human error can be avoided.

Furthermore, since the transfer head 110 which mounts components performs this height measurement, it is also possible to mount already measured components onto the board 120. Therefore, no electronic component P is necessary which serves the need for only height measurement.

Since the transfer head 110 is equipped with the scan measurement unit 130, the height of a component P can be measured while the transfer head 110 is moving, and therefore no loss occurs in takt time. Since the scan measurement unit 130 is very small, not only it is possible to avoid the positioning accuracy of the transfer head 110 from being reduced due to its own weight, but also it is possible even for such a small-sized scan measurement unit 130 to measure the height of a component with high accuracy.

Note that although the present embodiment has been described on the assumption that the height measurement unit 140 is integral with the mounter 100, the height measurement unit 140 needs not necessarily be integral with the mounter 100 and may be separate from the mounter 100 as a device for controlling the mounter 100.

Although the undersurface of a component P is positioned at the reference position C for the definitive measurement, the present invention is not limited to such positioning. The undersurface of the component P just has to be positioned in the high sensitivity portion (within the high sensitivity range) of the first line sensor 132.

Furthermore, the height data of an electronic component P which is present in the component library may be used instead of the value obtained by the tentative measurement so as to perform the definitive measurement based on this height data. In other words, the height may be measured by placing the undersurface of the component P in the high sensitivity portion of the first line sensor 132.

In the tentative measurement, the nozzle 111 needs not necessarily be lowered gradually, but may be lowered in a single stroke based on the height data of an electronic component P which is present in the component library.

Fifth Embodiment

Next, another embodiment of the present invention is described with reference to drawings. In the present embodiment, detailed operations for measuring tiny components are described.

Here, tiny components are 0402, 0603 and 1005 chip components, they have minute differences in size such as length, width, height, and the like. Such tiny components further include 1608R and 2625R chip components and other chip components which do not have such minute differences in size but have the heights of 0.5 mm or less.

The configuration of the present embodiment is same as that in the above embodiments, and the height measurement method in the present embodiment is same up to Step S507. Therefore, the descriptions thereof are omitted.

Figure 17:
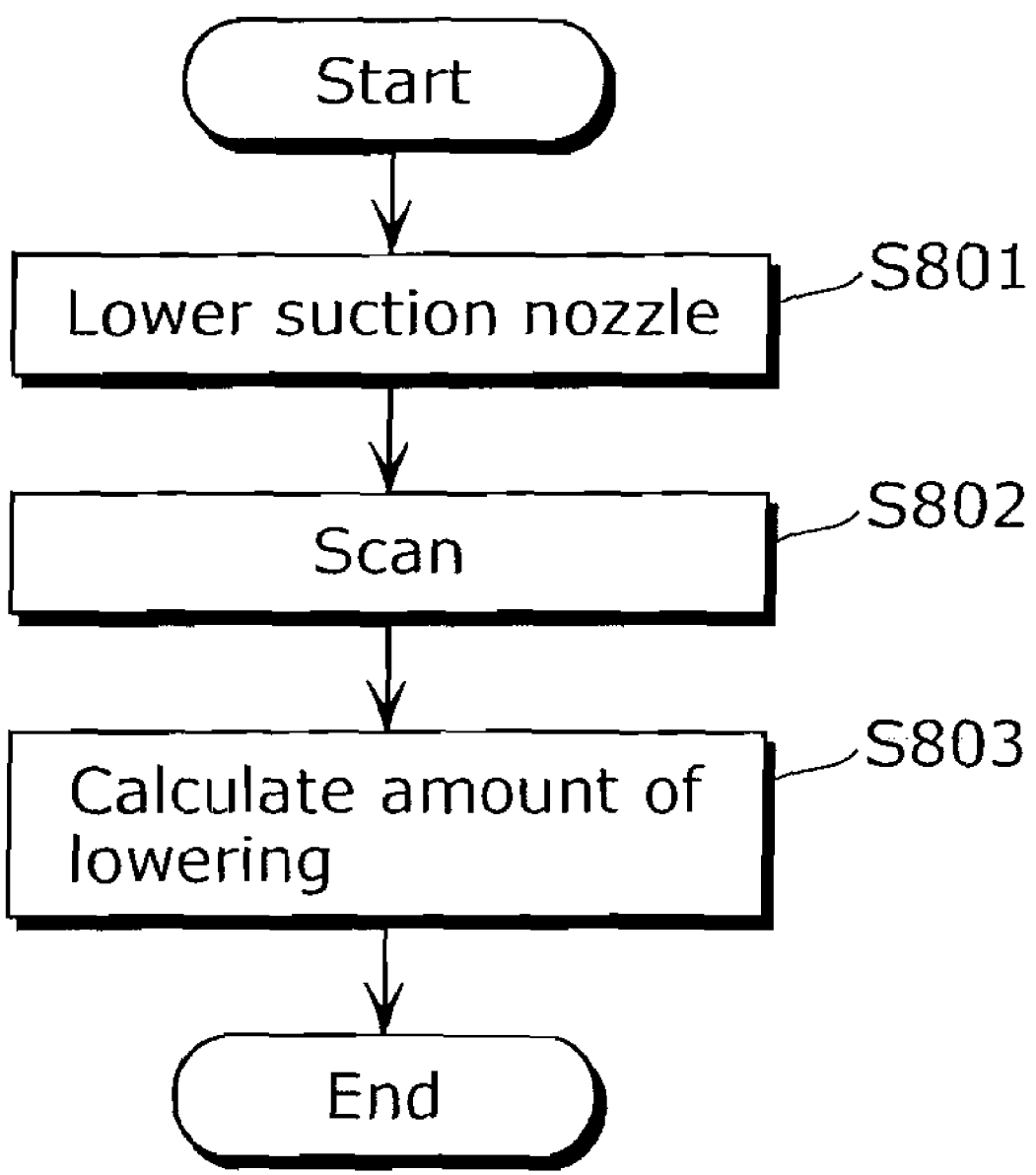
FIG. 17 is a flowchart showing an operation sequence for measuring the relationship between a set value for lowering a suction nozzle and an actual amount of lowering.

FIG. 17 is a flowchart showing the processes for measuring the relationship between a set value for lowering the nozzle 111 and an actual amount of lowering.

Figure 18:
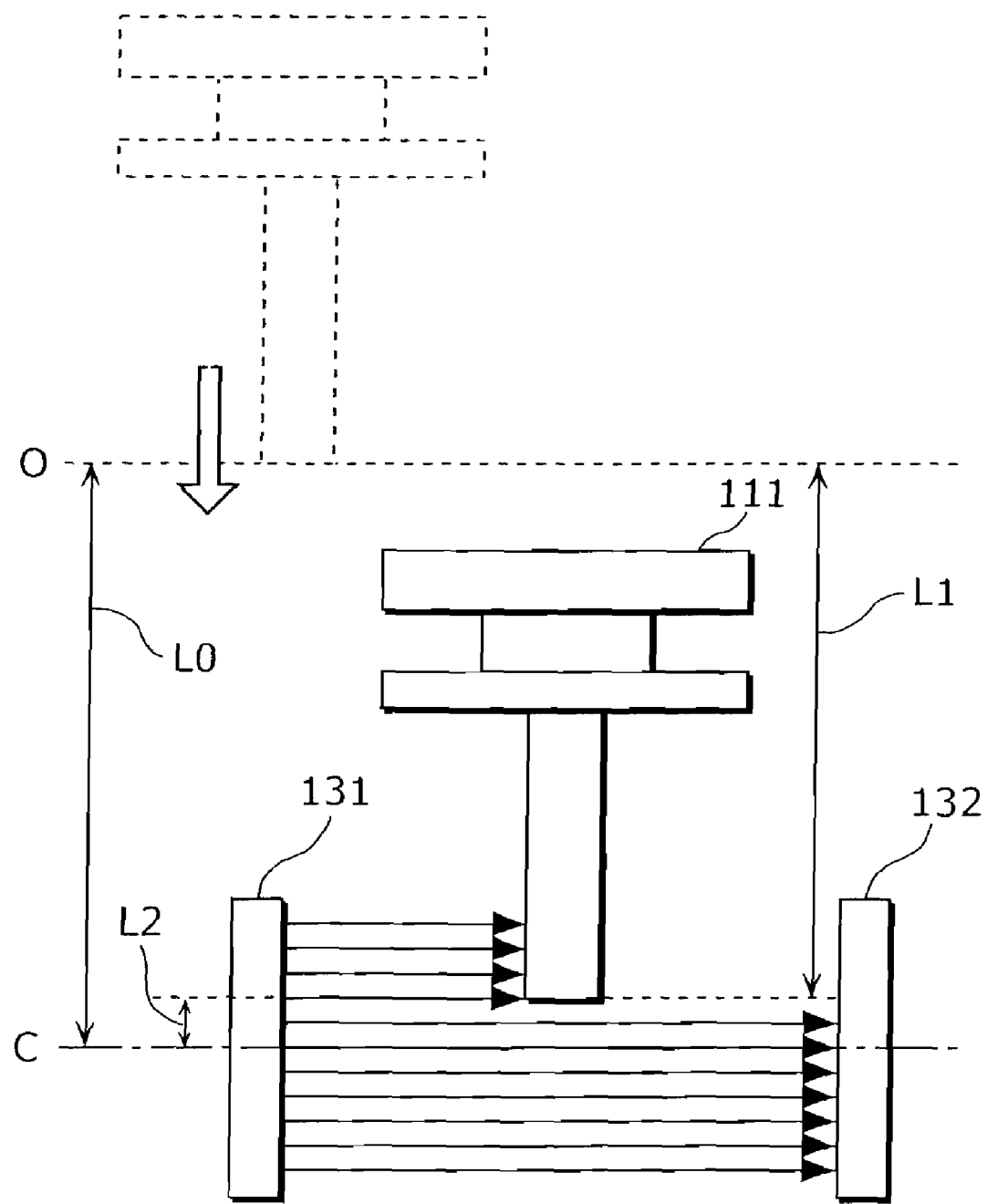
FIG. 18 is a side view showing a measurement of an amount of lowering of the suction nozzle.

FIG. 18 is a side view showing a measurement of an amount of lowering of the nozzle 111.

As shown in this diagram, the head control unit 143 lowers the nozzle 111 which does not hold an electronic component P (S801). To be more specific, a set value (for example, 5.5 mm) is previously given to the head control unit 143 so that the undersurface of the nozzle 111 is positioned at a level above, by a predetermined distance (for example, 0.5 mm), the reference position of the first line sensor 132, and the head control unit 143 controls the nozzle unit 112 so as to lower the nozzle 111 based on the signal from the encoder 114.

Next, the scan control unit 144 does scanning while controlling the scan measurement unit 130 to move (S802), while the measurement unit 141 obtains the distance L2 from the reference position C to the undersurface of the nozzle 111.

Next, the height calculation unit 142 subtracts the obtained distance L2 from the distance L0 (for example, 6 mm) between the original position 0 and the reference position C so as to calculate the actual amount of lowering L1 (S803).

As a result of the above calculation, the relationship between the above set value and the actual amount of lowering L1 is obtained. In the present embodiment, since the obtained amount L1 has little variation if the set value is assumed to be 5.5 mm, the repetitive error is far smaller than the error of lowering.

Figure 19:
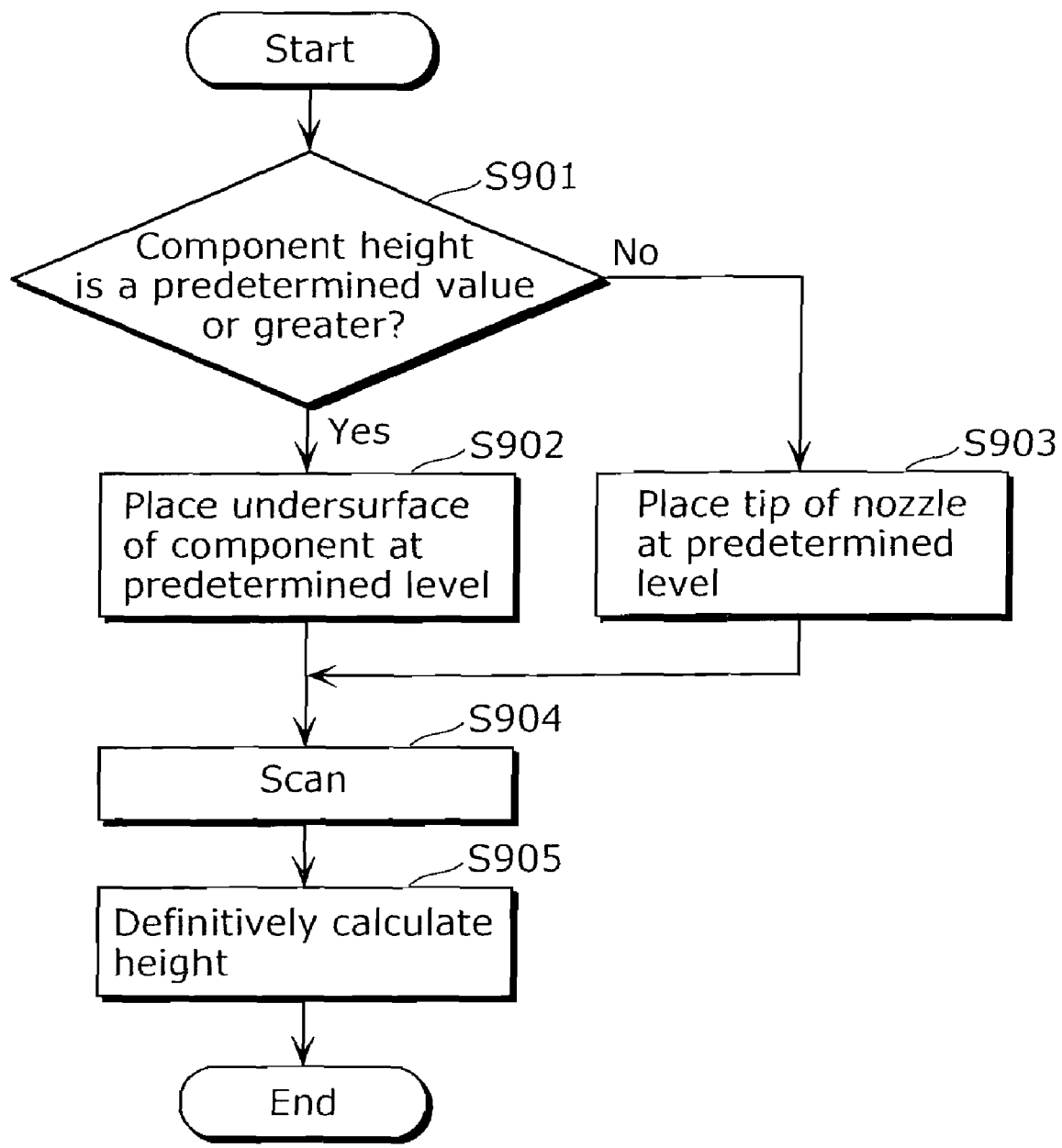
FIG. 19 is a flowchart showing an operation sequence for measuring the height of an electronic component in one of the embodiments of the present embodiment.

FIG. 19 is a flowchart showing an operation sequence of measuring the height of an electronic component P in the present embodiment.

After the tentative calculation of the height of an electronic component P is completed (Y in S507 in the above embodiment), it is judged whether or not the tentatively calculated height of the electronic component P is a predetermined value or greater (S901). This predetermined value may be set to, for example, a value five to ten times as great as the error between the actual amount of lowering of the nozzle 111 and the set value. For example, if the error is 50 μm, the predetermined value is set to 0.5 mm.

Since the present embodiment is directed to tiny components, it is judged to be N in S901. On the contrary, if common components, not tiny ones, are to be mounted, it is judged to be Y in S901.

Note that although the judgment is made in S901 based on the result of comparison between the tentatively measured value and the predetermined value, the judgment may be made depending on types of components. For example, it may be judged to be N in S901 if tiny components are to be mounted, while it is judged to be Y in S901 if the components other than tiny ones are to be mounted.

Figure 20:
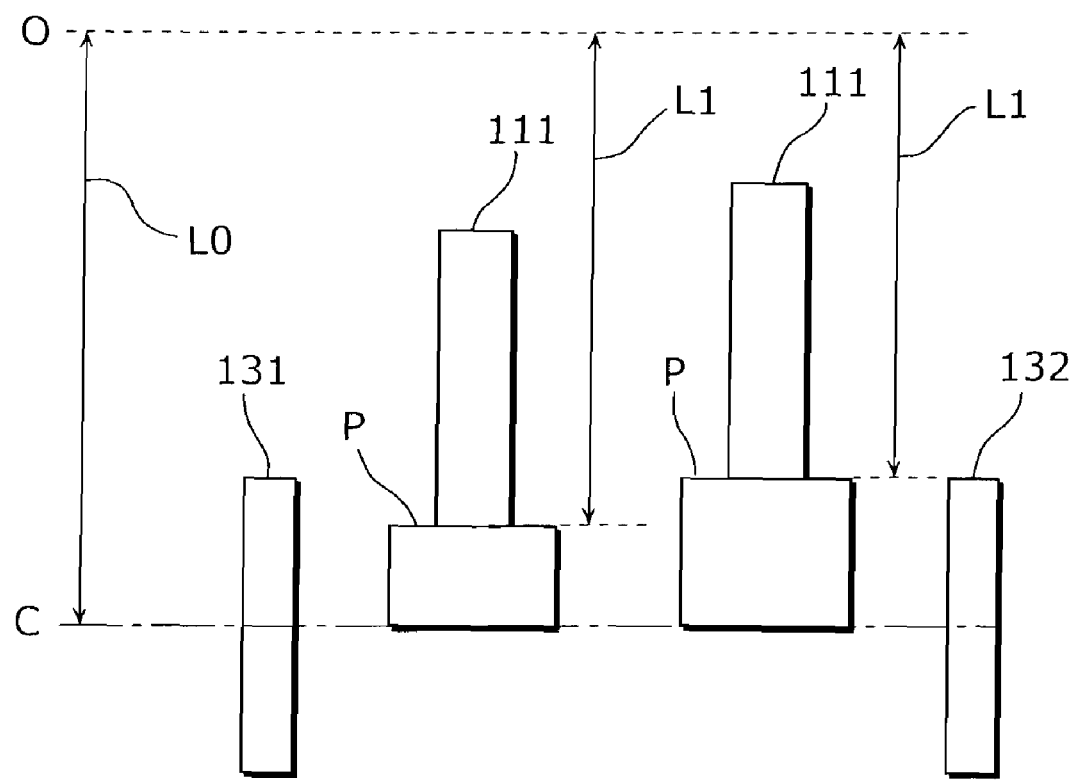
FIG. 20 is a side view showing an arrangement of relatively thick electronic components for measuring them.

Next, in the case where the tentatively calculated height is a predetermined value or greater (Y in S901), the nozzle 111 is lowered, as shown in FIG. 20 so that the undersurface of the nozzle 111 is in the position at which the electronic component P is definitively measured as in the above embodiment (S902).

Figure 21:
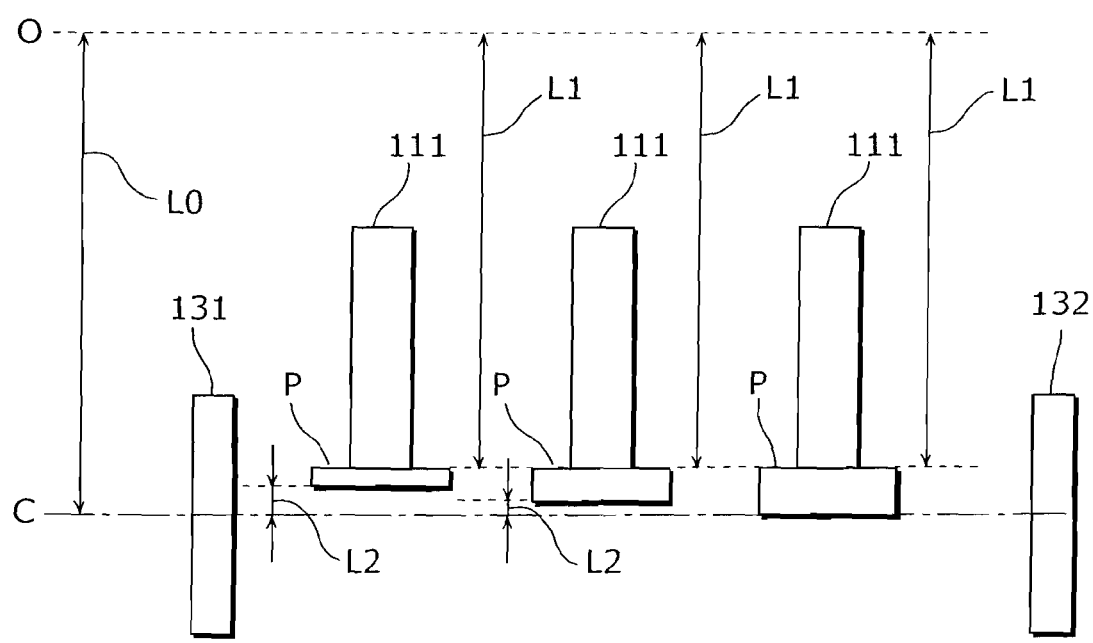
FIG. 21 is a side view showing an arrangement of relatively thin electronic components for measuring them.

On the other hand, in the case where the tentatively calculated height is less than the predetermined value (N in S901), as shown in FIG. 21, the electronic component P is lowered to the measurement position using the same set value as the value (5.5 mm) which has been set when measuring the amount of lowering of the nozzle 111 beforehand (S903).

Next, the scan measurement unit 130 is scanned (S904) so as to obtain a signal from the first line sensor 132.

Finally, the height PT of the electronic component P is calculated (S905). The height of the electronic component P is measured by the same method as in the above embodiment, using the equation PT=L0−L1−L2. In the case where the tentatively calculated height of the electronic component P is a predetermined value or less, the set value is not used as L1 in the above equation, but the value obtained by measurement without holding the electronic component P is used.

By adopting the above-described method, it is possible to reduce not only the error included in L2 but also the error included in L1 when the height of a relatively thin electronic component P is measured. Therefore, the error included in PT which is the measured height value can be reduced.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

According to the present invention, the height of an electronic component can be detected with high accuracy. Therefore, the present invention is useful in the field in which an electronic component in an electronic component supply unit is sucked up by a nozzle and mounted on a member to be mounted such as a board.

The invention claimed is:

1. A component height measurement method applied to a mounter equipped with a transfer head having a component-sucking-and-holding nozzle, for transferring a component and mounting the component onto a board, said method comprising:

tentatively lowering the nozzle and the component sucked and held by the nozzle, and tentatively measuring a height of the component using an amount of said tentative lowering of the nozzle and a signal outputted from a line sensor for measuring the height of the component, the line sensor being disposed laterally relative to the nozzle and extending vertically along a direction of movement of the nozzle;

lowering the component to within a high-accuracy range of the line sensor, based on the height of the component measured in said tentative measuring; and definitively measuring the height of the component using the line sensor.

2. The component height measurement method according to claim 1, further comprising:

lowering the nozzle in a state in which no component is held by the nozzle, and obtaining information regarding a vertical position of a lower end of the nozzle.

3. The component height measurement method according to claim 1, wherein said definitive measuring includes, in the case where the height measured in said tentative measuring is less than a predetermined value, definitively measuring the height of the component while keeping a vertical position of a lower end of the nozzle at a predetermined position.

4. The component height measurement method according to claim 1,
wherein said definitive measuring includes, in the case where the height measured in said tentative measuring is equal to or greater than a predetermined value, definitively measuring the height of the component while keeping a vertical position of a lower end of the nozzle at a predetermined position.

5. The component height measurement method according to claim 1,
wherein one of said tentative measuring and said definitive measuring is carried out while moving the line sensor and the component relative to each other on a horizontal plane, after the nozzle is maintained in a stationary state.

6. The component height measurement method according to claim 1,
wherein the transfer head has a plurality of nozzles and the line sensor, and
said definitive measuring includes measuring the height of each of the components sucked and held by the nozzles, by causing the line sensor to scan the components.

7. A component mounting method applied to a mounter equipped with a transfer head having a component-sucking-and-holding nozzle, for transferring a component and mounting the component onto a board, said method comprising:
tentatively lowering the nozzle and the component sucked and held by the nozzle, and tentatively measuring a height of the component using an amount of said tentative lowering of the nozzle and a signal outputted from a line sensor for measuring the height of the component, the line sensor being disposed laterally relative to the nozzle and extending vertically along a direction of movement of the nozzle;
lowering the component to within a high-accuracy range of the line sensor based on the height of the component measured in said tentative measuring;
definitively measuring the height of the component using the line sensor; and
mounting the component onto the board based on the definitively measured height of the component.

* * * * *